(12) United States Patent
Tredwell et al.

(10) Patent No.: US 8,384,041 B2
(45) Date of Patent: Feb. 26, 2013

(54) DIGITAL RADIOGRAPHIC IMAGING ARRAYS WITH REDUCED NOISE

(75) Inventors: Timothy J. Tredwell, Fairport, NY (US); Gregory N. Heiler, Hilton, NY (US)

(73) Assignee: Carestream Health, Inc., Rochester, NY (US)

(*) Notice: Subject to any disclaimer, the term of this patent is extended or adjusted under 35 U.S.C. 154(b) by 51 days.

(21) Appl. No.: 12/840,518

(22) Filed: Jul. 21, 2010

(65) Prior Publication Data

US 2012/0018627 A1    Jan. 26, 2012

(51) Int. Cl.
*G01T 1/20* (2006.01)

(52) U.S. Cl. .................. 250/370.11; 250/370.09

(58) Field of Classification Search ........... 250/370.09, 250/370.11
See application file for complete search history.

(56) References Cited

U.S. PATENT DOCUMENTS

| | | | |
|---|---|---|---|
| 4,293,877 A | 10/1981 | Tsunekawa et al. | |
| 6,034,406 A | 3/2000 | Kobayashi et al. | |
| 6,538,695 B1 | 3/2003 | Xiao et al. | |
| 7,495,228 B1* | 2/2009 | Albagli et al. | 250/370.09 |
| 2005/0141058 A1 | 6/2005 | Raynor | |
| 2009/0250619 A1* | 10/2009 | Nakamura | 250/370.09 |
| 2009/0290686 A1* | 11/2009 | Liu et al. | 378/162 |
| 2011/0127441 A1* | 6/2011 | Tanabe | 250/370.08 |
| 2012/0018627 A1* | 1/2012 | Tredwell et al. | 250/252.1 |

FOREIGN PATENT DOCUMENTS

| | | |
|---|---|---|
| EP | 0813339 | 12/1997 |
| EP | 1378942 | 1/2004 |
| JP | 06105069 | 4/1994 |
| WO | 2009/011465 | 1/2009 |

* cited by examiner

*Primary Examiner* — David Porta
*Assistant Examiner* — Casey Bryant

(57) ABSTRACT

Exemplary embodiments provide a radiographic array, flat detector panel and/or X-ray imaging apparatus including the same and/or methods for using the same or calibrating the same. Exemplary embodiments can reduce or address noise occurring in the optically sensitive pixels that is temporally not related to image data detected by the optically sensitive pixels or dark reference frames detected by the optically sensitive pixels. Exemplary embodiments can include a capacitive element in a calibration pixel coupled between a row conductive line and a column conductive line in an imaging array.

18 Claims, 21 Drawing Sheets

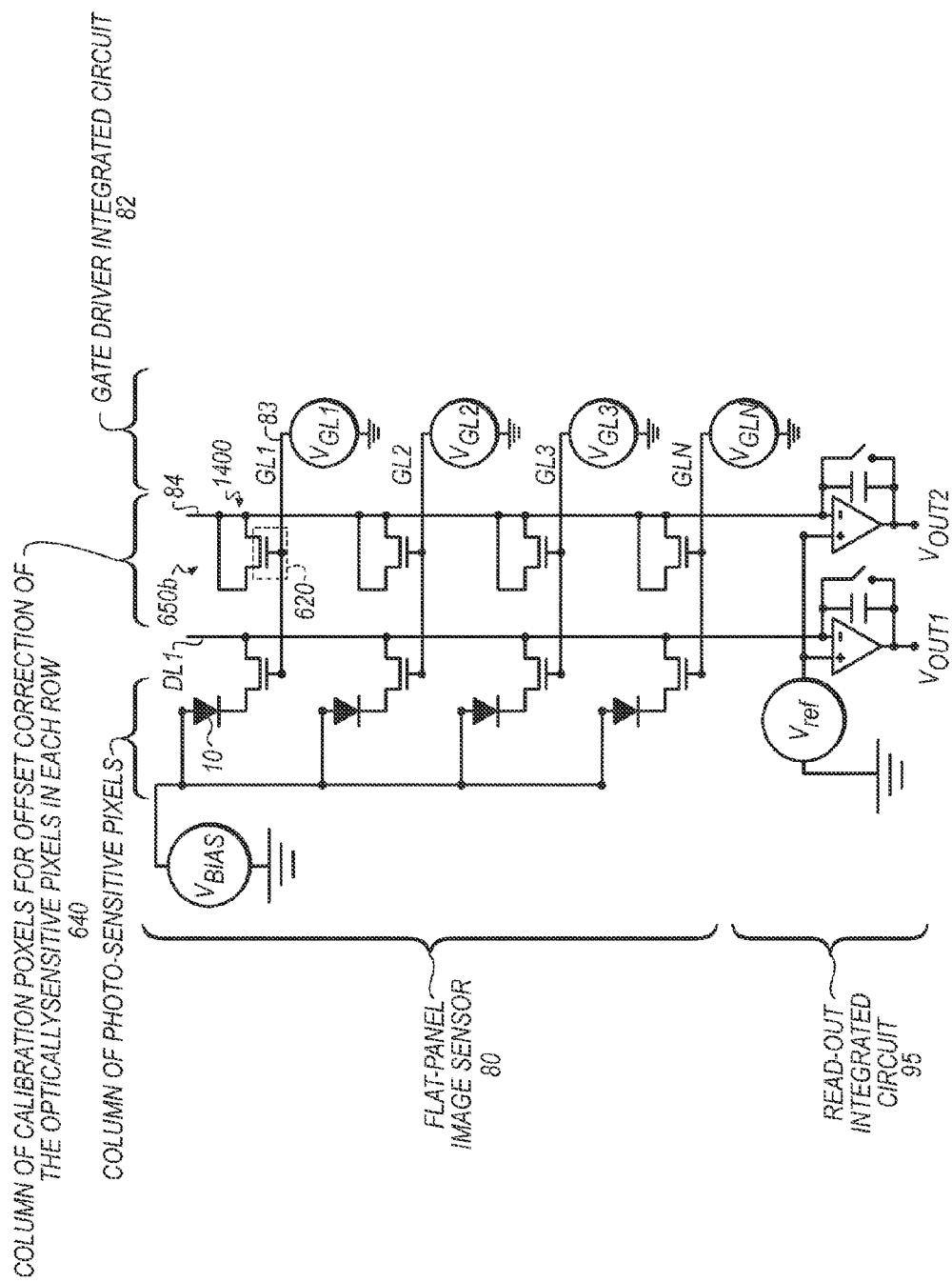

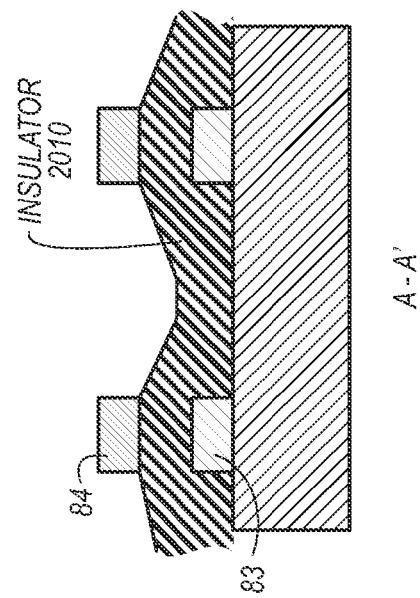
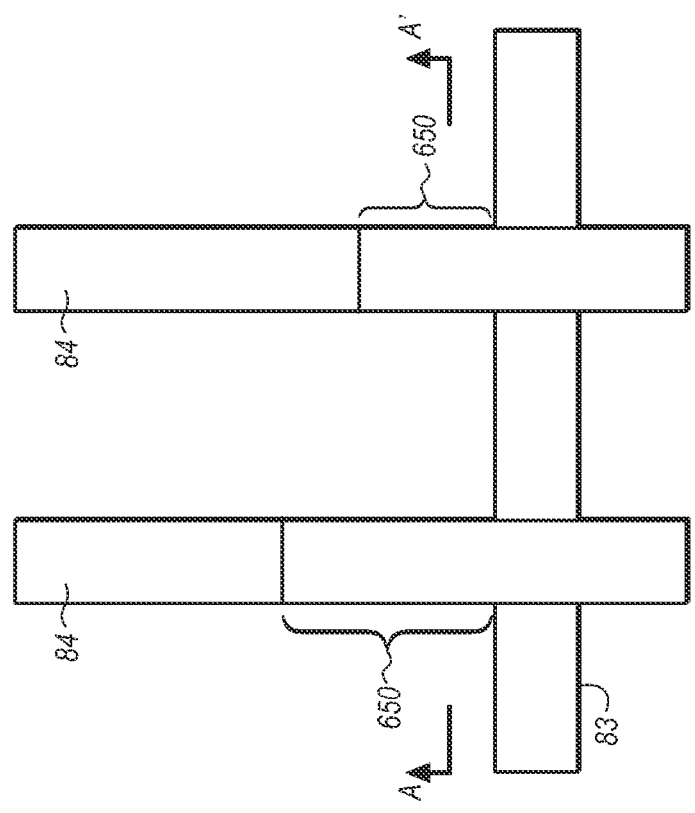
FIG. 20B
FIG. 20A

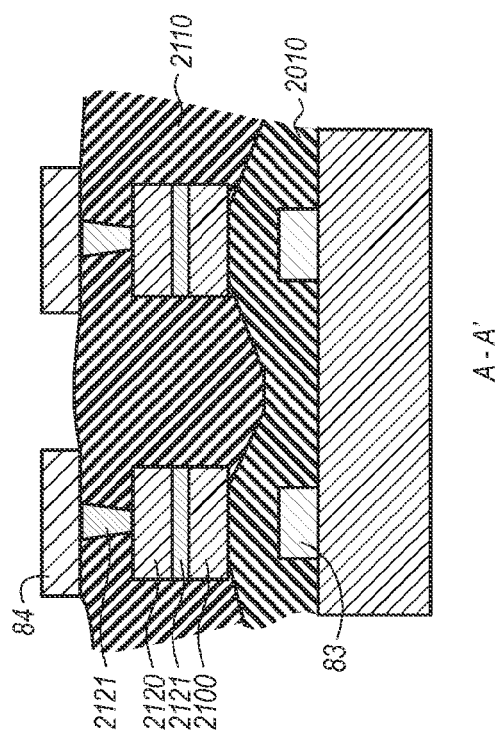
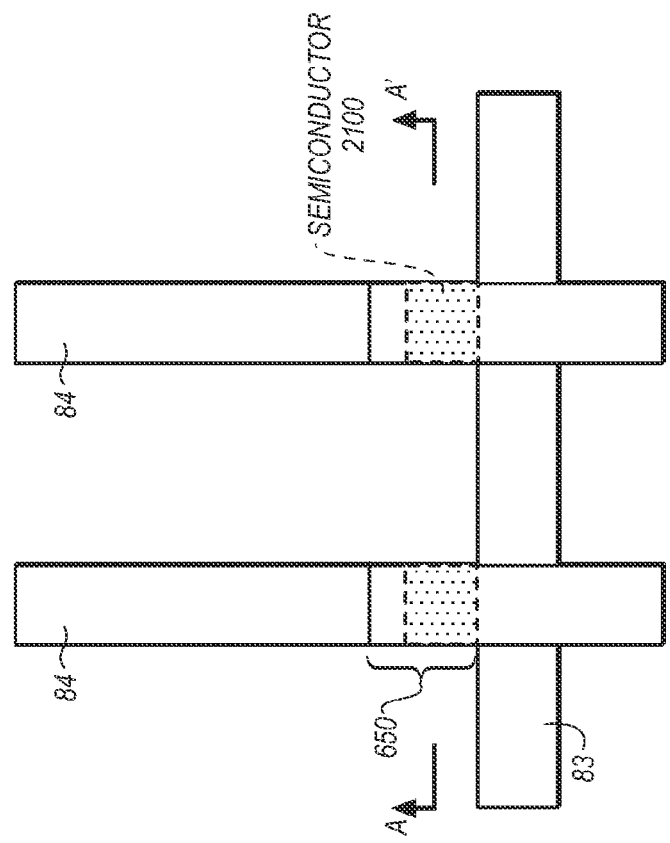
FIG. 21B
FIG. 21A

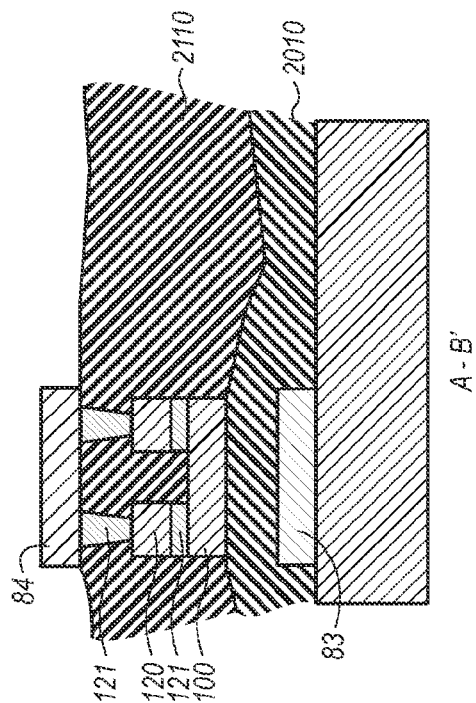
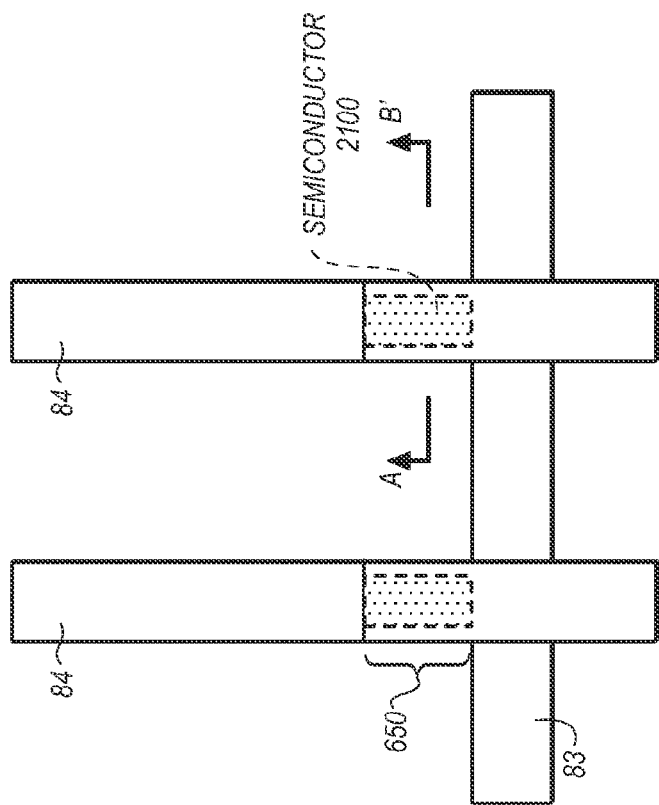
FIG. 22B
FIG. 22A

DIGITAL RADIOGRAPHIC IMAGING ARRAYS WITH REDUCED NOISE

TECHNICAL FIELD

This invention generally relates to digital radiographic imaging and more particularly relates to an imaging array using circuits (e.g., pixel) for calibration of pattern noise.

DESCRIPTION OF RELATED ART

A digital radiography (DR) imaging panel acquires image data from a scintillating medium using an array of individual sensors, arranged in a row-by-column matrix, in which each sensor provides a single pixel of image data. For these imaging devices, hydrogenated amorphous silicon (a-Si:H) is commonly used to form the photodiodes and the thin-film transistor (TFT) switches needed for each pixel, although both polycrystalline semiconductors such as laser recrystallized silicon and single-crystal silicon transistor switches can alternately be employed.

Conventional solid-state image sensors have utilized calibration columns containing light-shielded pixels to provide a dark offset value for calibration purposes. For example, U.S. Pat. Nos. 4,293,877 and 6,034,406A teach using light-shielded pixels in a solid-state imaging array to obtain a calibration of the dark offset for the pixels in a row of an image sensor. Both patents are herein incorporated in their entirety by reference.

SUMMARY

Embodiments relate to imaging arrays with calibration circuits or calibration pixels. Embodiments of calibration circuits or calibration pixels can be on the flat panel display and/or interspersed or integrated among optically sensitive pixels. For example, embodiments of calibration pixels can improve the reduction of noise across the arrays.

Exemplary embodiments provide radiographic sensing arrays, including a substrate, a scan line oriented substantially along a first direction, and a data line oriented substantially along a second direction. The array can further include at least one capacitive element configured as a calibration pixel disposed between the data line and the scan line over the substrate. The capacitive element can include a metal-insulator-metal type capacitor and/or a metal-insulator-semiconductor type capacitor. The array can further include a thin-film-transistor with first, second and third terminals. The first terminal can include a source, the second terminal can include a drain, and the third terminal can include a gate. The gate can be electrically connected to the scan line, and both the source and drain terminals can be electrically connected to the data line. The array can also further include a thin-film-transistor with first, second and third terminals, where the first terminal can include a source, the second terminal can include a drain, and the third terminal can include a gate. However the gate can be electrically connected to the scan line, the source can be electrically connected to a terminal of the capacitor, and the drain terminal can be electrically connected to the bias line.

Additional embodiments provide light sensing arrays including, a plurality of optically sensitive pixels formed over a substrate arranged in rows and columns forming a light-sensitive area. Each optically sensitive pixel can include, a scan line oriented along a row direction of the substrate, a data line oriented along a column direction of the substrate, a bias line, a thin-film-transistor switch with first, second and third terminals, the first terminal comprising a source, the second terminal comprising a drain electrically connected to the data line, and the third terminal comprising a gate electrically connected to the scan line, and a photosensitive element with at least first and second terminals, the first terminal electrically connected to the bias line and the second terminal electrically connected to the source of the thin-film-transistor switch. The array can also include a plurality of calibration pixels, where each calibration pixel can include, a scan line oriented along the row direction, a data line oriented along the column direction of the substrate, and a capacitor disposed between the data line and the scan line.

BRIEF DESCRIPTION OF THE DRAWINGS

Various features of the embodiments can be more fully appreciated as the same become better understood with reference to the following detailed description of the embodiments when considered in connection with the accompanying figures, in which:

FIG. 14 is a schematic diagram that shows another embodiment of a calibration circuit (e.g., calibration pixel) according to present teachings;

FIG. 20A is a diagram that shows an exemplary layout for an embodiment of a calibration pixel according to present teachings;

FIG. 20B is a cross-sectional diagram taken along line A-A' that shows of an exemplary configuration for the calibration pixel of FIG. 20A;

FIG. 21A is a diagram that shows an exemplary layout for an embodiment of a calibration pixel according to present teachings;

FIG. 21B is a cross-sectional diagram taken along line A-A' that shows of an exemplary configuration for the calibration pixel of FIG. 21A;

FIG. 22A is a diagram that shows an exemplary layout for an embodiment of a calibration pixel according to present teachings;

FIG. 22B is a cross-sectional diagram taken along line A-B' to shows of an exemplary configuration for the calibration pixel of FIG. 22A;

DESCRIPTION OF EXEMPLARY EMBODIMENTS

Figure 1:
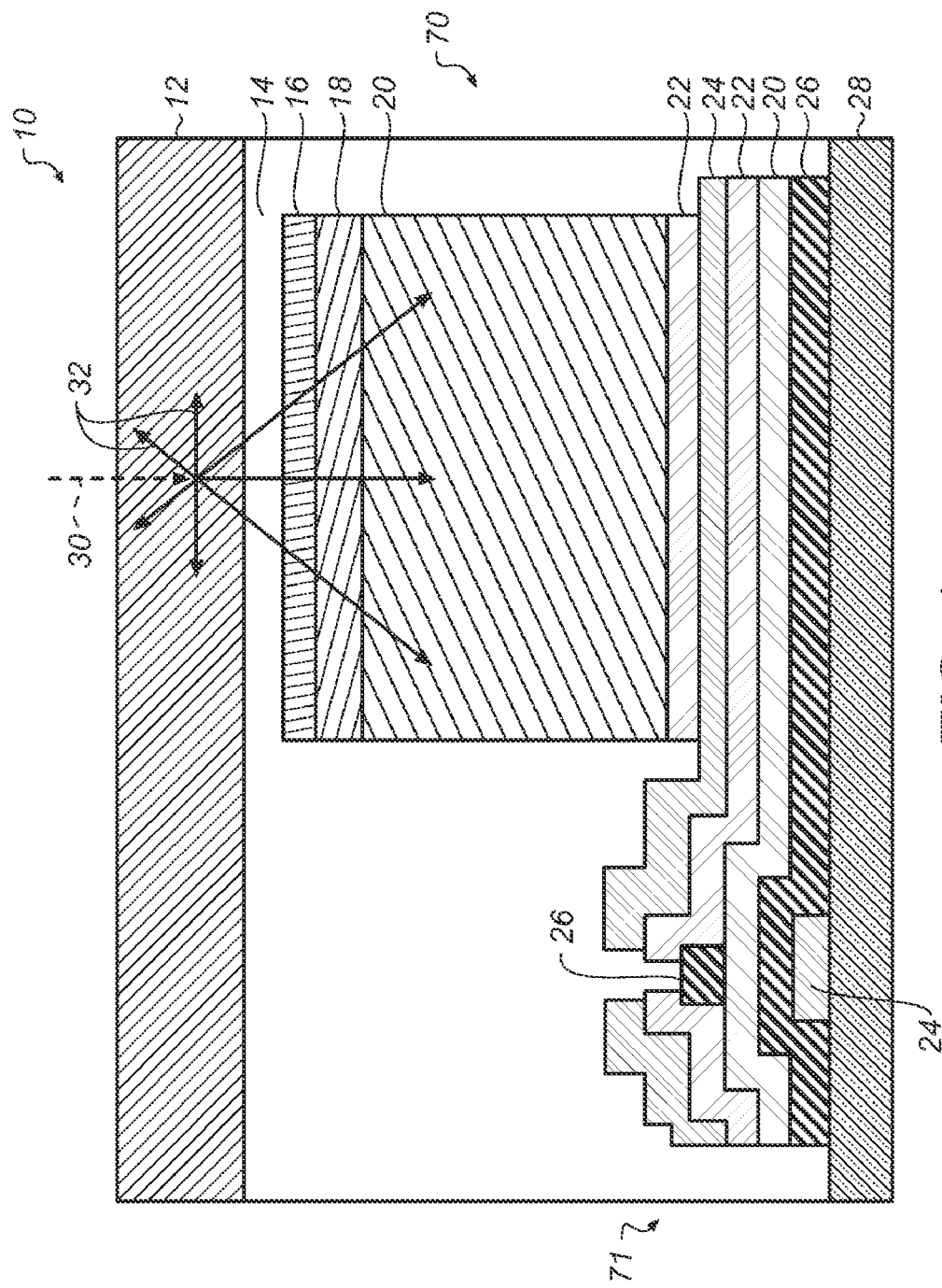
FIG. 1 is a diagram that shows a cross-sectional view of a related art imaging pixel in a flat-panel imager.

Reference will now be made in detail to present embodiments (e.g., exemplary embodiments) of the application, examples of which are illustrated in the accompanying drawings. Wherever possible, the same reference numbers will be used throughout the drawings to refer to the same or like parts. In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, merely exemplary.

For simplicity and illustrative purposes, the principles of the present application are described by referring mainly to exemplary embodiments thereof. Moreover, in the following description, references are made to the accompanying FIGS., which illustrate specific embodiments. Electrical, mechanical, logical and structural changes can be made to the embodiments without departing from the spirit and scope of the present invention. The following detailed description is, therefore, not to be taken in a limiting sense and the scope of the present invention is defined by the appended claims and their equivalents.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value equal to or greater than zero and a maximum value equal to or less than 10, e.g., 1 to 5. Furthermore, to the extent that the terms "including", "includes", "having", "has", "with", or variants thereof are used in either the detailed description and the claims, such terms are intended to be inclusive in a manner similar to the term "comprising." As used herein, the term "connected" means electrically connected either directly or indirectly with additional elements in between. As used herein, the term "one or more of" or "and/or" with respect to a listing of items such as, for example, "A and B" or "A and/or B", means A alone, B alone, or A and B. The term "at least one of" is used to mean one or more of the listed items can be selected.

Further, in the discussion and claims herein, the term "on" used with respect to two materials, one "on" the other, means at least some contact between the materials, while "over" means the materials are in proximity or near each other, but possibly with one or more additional intervening materials such that contact is possible but not required. Neither "on" nor "over" nor "under" implies any directionality as used herein. The term between as used herein with respect to two elements means that an element C that is "between" elements A and B is spatially located in at least one direction such that A is proximate to C and C is proximate to B or vice versa. The term "conformal" describes a coating material in which angles of the underlying material are preserved by the conformal material.

Figure 2:
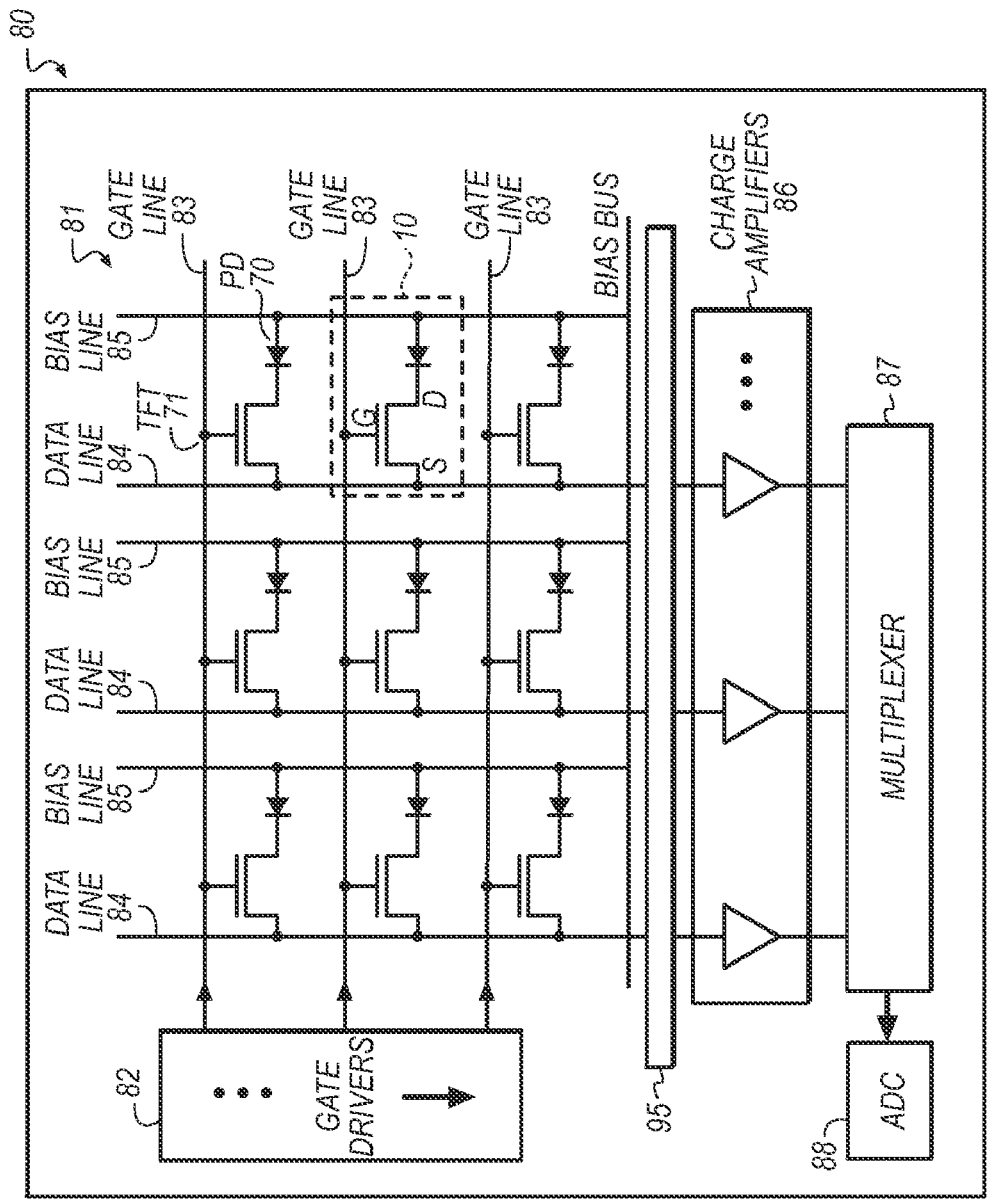
FIG. 2 is a schematic diagram showing components of a related art flat-panel imager.

Related art imaging arrays typically include a frontplane, which has an array of photosensitive elements, and a backplane, which has an array of TFT switches arranged in a row-by-column matrix. FIG. 1 shows a cross-section (not to scale) of structure of a single imaging pixel 10 for a related art a-Si:H based flat panel imager array 81. FIG. 2 shows a schematic for such an array 81 having multiple pixels 10. Each imaging pixel 10 can have a photosensor 70, for example, a photodiode, and a switch 71, for example, TFT switch. A layer of X-ray converter material 12 (e.g., luminescent phosphor screen, scintillator) can be coupled to the photodiode-TFT array 81. With reference to FIG. 1, and as will be understood, photodiode photosensor 70 can have the following layers: a passivation layer 14, an indium tin oxide layer 16, a p-doped Si layer 18, an intrinsic a-Si:H layer 20, an n-doped Si layer 22, a metal layer 24, a dielectric layer 26, and a glass substrate 28. X-ray photon path 30 and visible light photon path 32 are also shown in FIG. 1. When a single X-ray is absorbed by the phosphor screen 12, a large number of light photons are emitted isotropically, however only a fraction of the emitted light reaches the photodiode 70 and can thereby be detected.

FIG. 2 shows a schematic block diagram of a related art flat panel imager 80. Flat panel imager 80 can include a sensor array 81 including a matrix of a-Si:H n-i-p photodiodes photosensor 70 and TFTs 71. Gate line clocks 82 can connect to the blocks of gate lines 83, and read out circuit 95 connect to blocks of data lines 84 and bias lines 85. Charge amplifiers 86 can have optional double correlated sampling circuits with programmable filtering (not shown) to help reduce noise. Charge amplifier 86 output can go to analog multiplexer 87 and analog-to-digital converter (ADC) 88 to stream out the digital image data at desired rates.

Referring to FIGS. 1 and 2, operations of the a-Si:H-based indirect flat panel imager 80, familiar to those skilled in the art, can be briefly described as follows. Incident X-ray photons 30 can be converted to optical photons 32 in the phosphor screen 12, and these optical photons can be subsequently converted to electron-hole pairs within the a-Si:H n-i-p photodiodes 70. In general, a reverse bias voltage can be applied to bias lines 85 to create an electric field (and hence a depletion region) across the photodiodes 70 and enhance charge collection efficiency. The pixel charge capacity of the photodiodes 70 can be a product of the bias voltage and the photodiode capacitance. The image signal can be integrated by the photodiodes 70 while the associated TFTs 71 are held in a non-conducting (e.g., "off") state. This can be accomplished by maintaining gate lines 83 at a negative voltage. The array can be read out by sequentially switching rows of TFTs 71 to a conducting state by means of TFT gate control circuitry (not shown). When a row of pixels is switched to a conducting (e.g., "on") state by applying a positive voltage to corresponding gate line 83, charge from those pixels 10 can be transferred along data lines 84 and integrated by external charge-sensitive amplifiers 86. The row can then be switched back to a non-conducting state, and the process can be repeated for each row until the entire array 81 has been read out. Signal outputs from external charge-sensitive amplifiers 86 can be transferred to analog-to-digital converter (ADC) 88 by parallel-to-serial multiplexer 87, subsequently yielding a digital image.

Advantageously, the flat panel imager 80 having an imaging array 81 as described with reference to FIGS. 1 and 2 can be capable of single-shot (radiographic), dual-shot, multiple-shot (used typically for volumetric imaging such as tomosynthesis or cone-beam computed tomography) and continuous (used in fluoroscopy) image acquisition.

Figure 3:
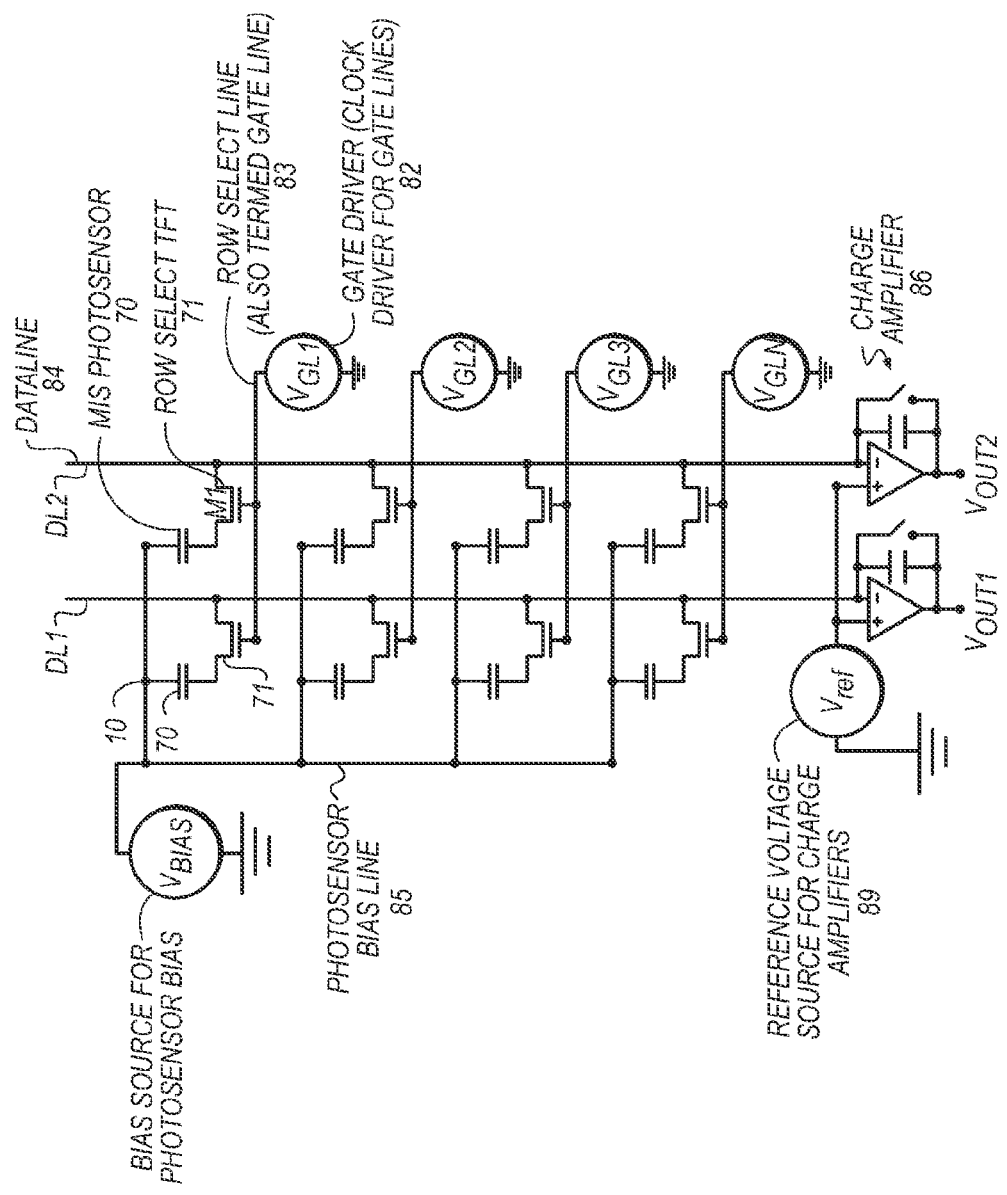
FIG. 3 is a schematic diagram of a related art pixel incorporating MIS photosensors.
Figure 4:
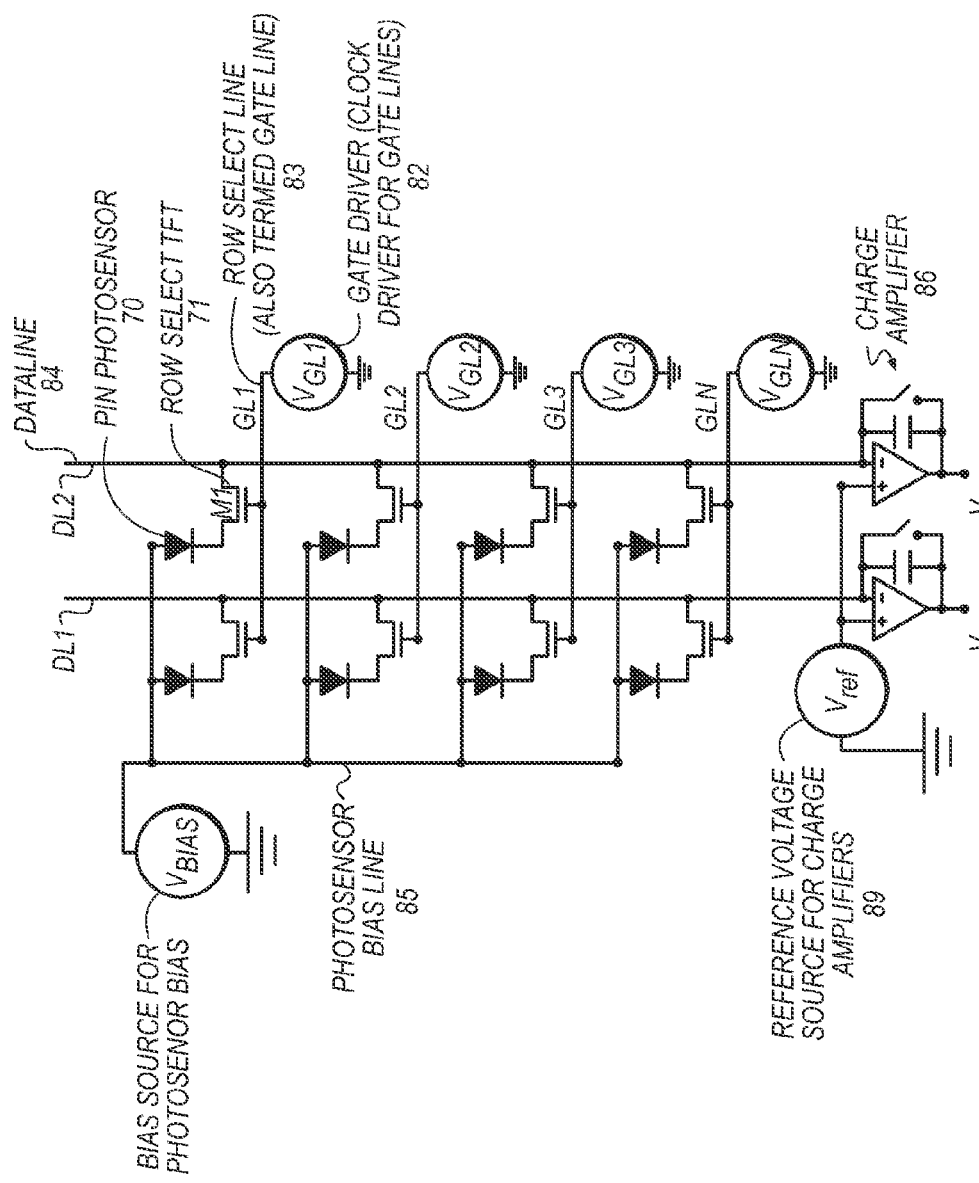
FIG. 4 is a schematic diagram of a related art pixel incorporating PIN photodiodes.

While existing digital radiographic imaging arrays show promise, there are limitations that can affect performance, including signal quality. For example, existing devices can be subject to noise sources, including common-mode noise from gate line switching, power supply noise and ripple, and electromagnetic interference (EMI) pickup. FIG. 3 shows a circuit diagram for a related art thin-film transistor array 81 with a 1-transistor passive pixel 10 architecture with a metal-insulator-semiconductor (MIS) photosensor 70 and FIG. 4 shows a circuit diagram for a related art transistor (e.g., thin-film transistor) array 81 with a 1-transistor passive pixel 10 architecture with a PIN photosensor 70.

Overlap capacitance 605 can include the physical overlap of the gate line 83 and the data line 84, as well as the capacitances between the sources of the thin-film row select transistors 71 and the gates of those transistors 71. Any noise or ripple on the power supply for the gate line clocks 82 (e.g., gate driver ICs) can feed through onto the data lines 84. The ratio of the sum of the gate line 83 to the data line 84 overlap capacitances 605 to the total capacitance 610 of the data line 84 can be expressed as:

$$\Delta V_{noise\,feedthrough} = \Delta V_{noise} \cdot N_{rows} \cdot C_{overlap}/C_{dataline} \quad (1)$$

Where $\Delta V_{noise\,feedthrough}$ is the voltage noise appearing on the data lines 84 due to a $\Delta V_{noise}$ noise voltage on the row select lines (gate lines 83), $N_{rows}$ is the number of rows in the image sensor, $C_{overlap}$ is the overlap capacitance 605 between one row select line 83 and one data line 84, and $C_{dataline}$ is the total data line 84 capacitance 610. The corresponding noise charge $\Delta Q_{noise\,feedthrough}$ sensed by the charge amplifier 86 can be expressed as:

$$\Delta Q_{noise\,feedthrough} = \Delta V_{noise} \cdot N_{rows} \cdot C_{overlap} \quad (2)$$

For a typical image sensor 80, the total overlap capacitance 605 $N_{rows} \cdot C_{overlap}$ is typically about half or more of the data line 84 capacitance 610. Therefore, for a typical 10 mV noise voltage on the gate lines 83, (for example from power supply noise or clock driver noise) the noise voltage on the data line 84 would be about 5 mV, which is well within the signal range for the diagnostic region of interest for digital radiographic applications such as chest radiography, mammography or fluoroscopy. As power supply noise and electro-magnetic pick-up are not correlated in frequency or phase with the readout timing for the imaging array, this noise is uncorrelated from frame to frame and cannot be canceled by subtraction of one or more dark reference frames captured prior to or following an X-ray exposure(s).

In many related art thin-film transistor arrays 81 for digital radiographic sensing, the $C_{overlap}/C_{dataline}$ ratio can be typically 0.5 to 0.9 since the overlap capacitance comprises the majority of the data line 84 capacitance 610. Sources of noise or ripple in the gate line power supplies can include noise from switching in switching power supplies, electro-magnetic pick-up on power supply bias lines, and circuit noise in the integrated circuit used for generating the row-select clock pulses. As this gate line noise can be temporally uncorrelated with the array readout timing, it cannot be removed by subtraction of dark reference frames prior to or following the frame corresponding to the radiographic exposure.

Another source of noise in related art thin-film transistor arrays 81 for digital radiography can be the feedthrough of the gate line row-select clock 82 onto the data line 84. During readout, row select can be performed by clocking the gate lines 83 sequentially between an "off" voltage which maintains the TFT switch 71 in the pixel 10 in a high-resistance state to an "on" voltage which turns the TFT switch 71 in the pixels 10 in that row to a low-resistance state. For amorphous silicon or polycrystalline silicon thin film transistors, this voltage can be typically about 20V or higher. The feedthrough voltage can be expressed as:

$$V_{feedthorugh} = \Delta V_{row\,select} \cdot C_{overlap}/C_{dataline} \quad (3)$$

And the feedthrough charge $Q_{feedthrough}$ can be expressed as:

$$Q_{feedthrough} = \Delta V_{row\,select} \cdot C_{overlap} \quad (4)$$

Where $\Delta V_{row\,select}$ is the voltage swing on the row select line, $C_{overlap}$ is the overlap capacitance 605 between a row select line (e.g., gate line 83) and a data line 84, and $C_{dataline}$ is the total data line 84 capacitance 610. Since the overlap capacitance 605 is generally about half or more of the total data line 84 capacitance 610 in thin-film TFT arrays 81 for digital radiographic applications, the resulting feedthrough voltage can be significant as compared to the signal charge. For an exemplary related art radiographic array with 2,000 rows, the feedthrough voltage from about a 20V clock pulse can be about 10 mV, which can be equivalent to a signal level well within the diagnostic region of interest for most radiographic applications. This coupling can not entirely be reversed when the device is subsequently switched off, making it potentially difficult to calibrate for such an offset. The noise resulting from electromagnetic pick-up or gate-line power-supply ripple is substantially the same in all columns within a row, although the impedance of the gate line due to its resistance and capacitance may cause low spatial frequency variation (e.g., shading) of the noise across the radiographic imaging array.

Yet another source of noise in related art thin-film transistor arrays for digital radiography can be the electro-magnetic pick-up on the data lines 84. In radiographic imaging applications, the array 80 dimensions can range from about 12 inches to about 17 inches in length. These 12 inch to 17 inch long data lines 84 can act as antennas and pick up signals from stray electromagnetic fields. These stray electromagnetic fields can be caused by sources such as electromagnetic emission from circuit boards supporting the radiographic imaging array, which are normally in close proximity to the array, electromagnetic fields from the X-ray generator used in conjunction with the radiographic imaging panel, electromagnetic fields from building power lines, radio-frequency communications, equipment operating in the proximity of the radiographic imaging system, other sources of electromagnetic fields external to the panel, etc. Since power supply noise and electro-magnetic pick-up cannot be correlated in frequency or phase with the readout timing for the imaging array, this noise is uncorrelated from frame to frame and cannot be canceled by subtraction of one or more dark reference frames captured prior to or following the X-ray exposure.

Yet another source of noise in related art thin-film transistor arrays for digital radiography can be voltage ripple on the reference supply voltages for each of the charge amplifiers 86. The charge amplifiers typically can be implemented in single-crystal silicon integrated circuits in which each silicon die contains multiple charge amplifiers, data multiplexing and often analog-to-digital conversion. The number of charge amplifiers per die is typically 64 to 512. For example, a radiographic panel with 3,072 columns would have 12 charge amplifier die of 256 channels each. The reference voltage (e.g., reference voltage 89) is common to all charge amplifiers within a given die. Ripple in the reference voltage 89 for the charge amplifiers 86 within a die can result in an offset in the reset voltage of the photosensor, which can appear in the corresponding image as a signal offset common to every pixel within a block of photosensors within that row. Since the ripple of the reference supply for one charge amplifier die can be different from that of an adjacent charge amplifier die, the resulting image can display block artifacts.

Another source of noise in related art thin-film transistor arrays for digital radiography can be electro-magnetic pick-up and bias supply noise on the bias lines 85 for the photosensitive elements 70 in the pixels 10. Referring to the circuit diagram of FIG. 3 for a passive-pixel imaging array 81 with MIS photosensor 70, while the TFT switch 71 is in the "off" state, any noise on the bias supply line $V_{BIAS}$ can couple through the MIS capacitance $C_{MIS}C_{ox}+C_{si}$ and result in a corresponding voltage fluctuation on the first terminal of the thin-film-transistor switch 71. Unless this fluctuation is sufficiently large to affect leakage in the TFT switch 71, it cannot be a noise source. However, during the time when a particular row is being addressed, the TFT switch 71 is in the "on" state (e.g., low resistance) and a fluctuation in the bias supply line $V_{BIAS}$ can result in a noise charge on the feedback capacitor of the charge amplifier that can be expressed as:

$$\Delta N = \Delta V_{BIAS} * C_{MIS}/q \quad (5)$$

Where ΔN is the number of offset electrons on the feedback capacitor of the charge amplifier, and q is the electron charge. In exemplary radiographic detector cassettes subject to electromagnetic interference from sources such as 60 Hz power, electro-magnetic pick-up from the bucky grid motors used to move the X-ray grid, X-ray tube, and system EMI, and power supply ripple from switching or linear power supplies, $\Delta V_{BIAS}$ can be about 100 μV to about 10 mV rms. For a typical 2 pF capacitance for a MIS photosensor of about 100 μm×about 100 μm dimension, the corresponding noise charge on the photosensor would be 1,250-125,000 rms electrons. Because of the long length (typically 43 cm) of the bias lines 85, they can be highly susceptible to electromagnetic pick-up. As the power supply noise and electro-magnetic pick-up cannot be correlated in frequency or phase with the readout timing for the imaging array, this noise (e.g., input through the bias line) is uncorrelated from frame to frame and cannot be canceled by subtraction of one or more dark reference frames captured prior to or following the X-ray exposure. Referring to the circuit diagram of FIG. 4 for a passive-pixel imaging array 81 with PIN photosensor 70, the corresponding offset charge ΔN would be about 1,875 rms electrons to about 187,500 rms electrons, which can be as large or larger than the signal level due to X-ray exposure in many radiographic applications.

Given these difficulties, there would be various advantages to row offset reference circuitry that can measure of the offset value of each row in the imaging array without the effect of dark current or defects common to light-shielded pixels, and that can use less area than light-shielded pixels. Additional advantages can result from row offset reference circuitry that can amplify the value of the offset value of each row, which can allow higher signal-to-noise sampling of the row offset value.

Embodiments according to present teachings include radiographic detector arrays including calibration pixels. Such radiographic detector arrays can be part of a flat panel detector (e.g., digital) or a complete radiographic imaging apparatus. The calibration pixels can include a capacitive element, a capacitor, a transistor, a TFT, two capacitors, a TFT and a capacitor, a TFT and two capacitors, and combinations thereof. The calibration pixels provided can be used to remove various noise sources, including overlap capacitance, EMF noise, feed through noise, clock noise, bias line noise, gate line noise, data line noise, etc.

Figure 5:
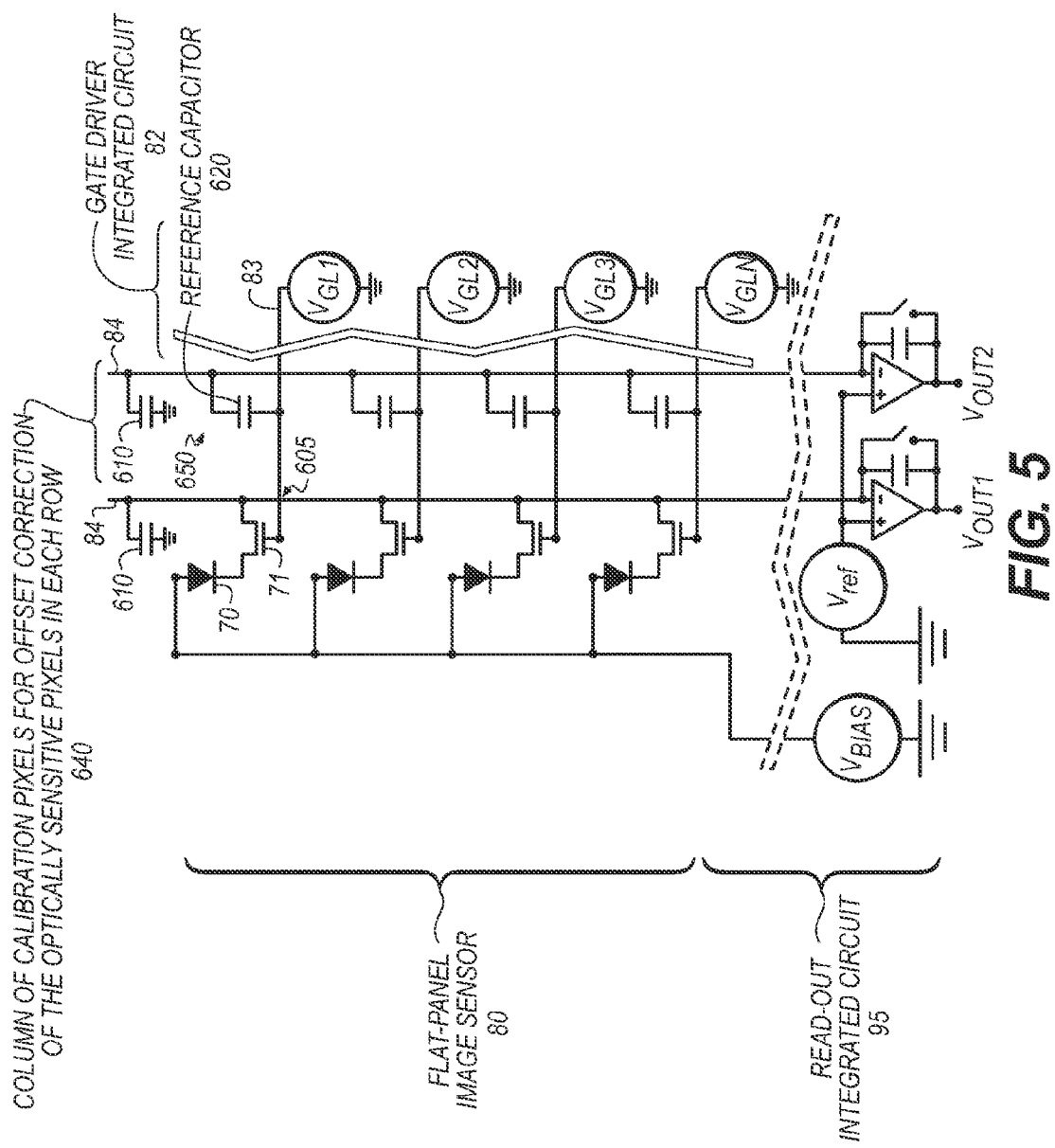
FIG. 5 is a schematic diagram that shows an embodiment of a calibration circuit (e.g., calibration pixel) according to present teachings.

FIG. 5 is a schematic diagram that shows an embodiment of a calibration circuit (e.g., calibration pixel 650) according to present teachings. As shown in FIG. 5, an embodiment of a capacitive element between data line and gate line can be employed to emulate the parasitic capacitive coupling between data line and gate line. FIG. 5 shows a schematic diagram of a 2 by 4 pixel section of a passive-pixel image sensor 80 with PIN photosensor 70. At the end of each row of photosensors 70 is a first type of calibration pixel 650. A set of calibration pixels 650 can form a column 640 of calibration pixels 650. More than one column 640 of calibration pixels 650 can be used. The calibration pixel 650 and/or a subset or all of the calibration pixels 640 can be used for row offset calibration and/or column offset calibration. The calibration pixel 650 can include a capacitive element including a capacitor 620 (e.g., a metal-insulator-metal (MIM) capacitor, metal-insulator-semiconductor (MIS) capacitor, etc.) between the gate line 83 and the data line 84. In one embodiment, the capacitance of the capacitor 620 is approximately equal to the total overlap capacitance 605 between the data line 84 and the gate line 83 in an optically sensitive pixel 10 of the imaging array 80. However, exemplary embodiments of the application are not intended to be so limited, for example, the capacitance of the capacitor 620 can be greater (or less than), double, a binary multiple, an integer multiple or a fractional multiple of the capacitance of the overlap capacitance 605. The total overlap capacitance 605 can include components caused by the crossover between the data line 84 and the gate line 83 and the source-to-gate capacitance of the TFT switch 71, in addition to smaller parasitic capacitance components. For example, if the flat-panel amorphous silicon image sensor 80 has about a 150 micron pixel 10 dimension and a switching transistor 71 with a gate width of about 20 microns, then the total capacitance can be about 50 fF per pixel.

Figure 6:
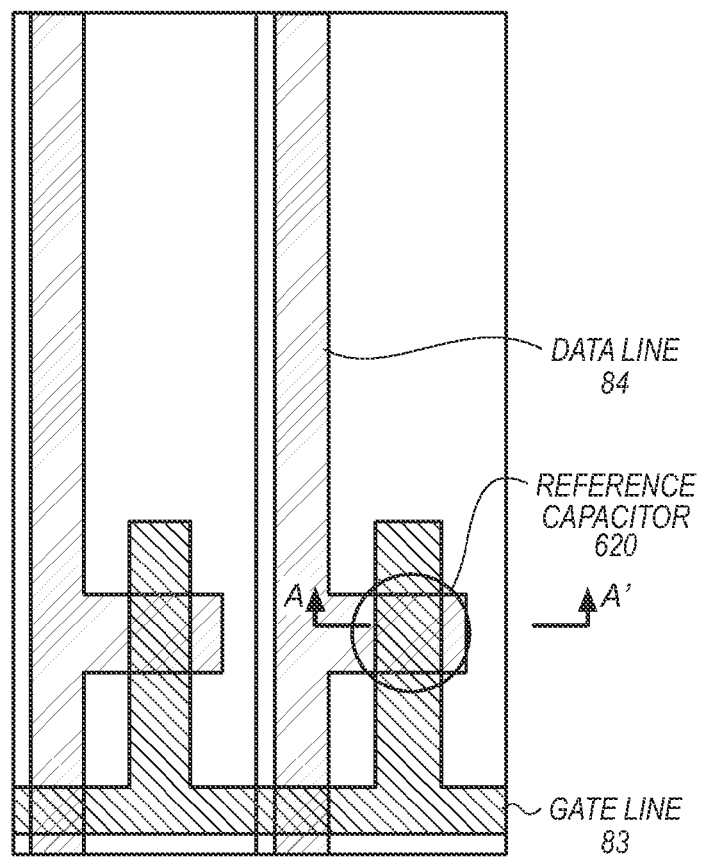
FIG. 6 is a diagram that shows an exemplary layout for the calibration pixel of FIG. 5.
Figure 7:
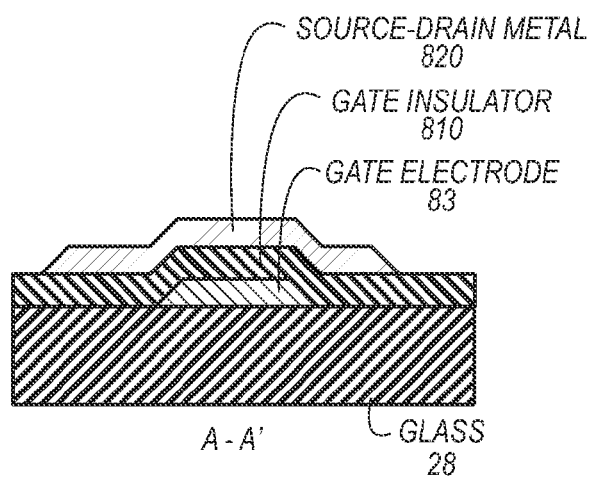
FIG. 7 is a cross-sectional diagram taken along line A-A' that shows of an exemplary calibration pixel of FIG. 6.

FIG. 6 is a diagram that shows an exemplary layout for the calibration pixel 650 of FIG. 5, and FIG. 7 is a diagram that shows an exemplary cross-sectional of the exemplary calibration pixel of FIG. 6. As shown, one terminal of the capacitor 620 can be formed by the gate electrode metal or gate lines 83 (e.g., about a 250 nm thick sandwich of about 50 nm Mo, about 150 nm Al:Nd, and about 50 nm Mo), the second terminal of the capacitor 620 can be formed by source-drain metal (e.g., about a 250 nm thick sandwich of about 50 nm Mo, about 150 nm Al:Nd, and about 50 nm Mo), and the capacitor 620 dielectric can be a dielectric (e.g., about 400 nm silicon nitride). In one embodiment, the capacitor 620 dielectric can be a gate insulator 810. In the previous example embodiment, in order to equal the 50 fF overlap capacitance 605 per pixel, the capacitor area of the calibration pixel 650 can be about 8 microns wide by about 50 microns long and can be located adjacent to the data line 84. In this example layout, as shown in FIG. 6, the pixel pitch in the column direction of the calibration pixels can be about 20 μm, as compared to about 150 μm for the optically active pixels 10. For a total of about 16 calibration pixels 650 on both sides of the array 81, the width of a region of the calibration pixels 650 could be about 320 μm. This exemplary spacing when compared to, for example, the spacing associated with dark reference pixels (e.g., 2,400 μm) can allow the imaging pixels 10 to be placed much closer to the edge of the imaging array 81. This can be advantages or very important for many radiographic imaging applications, such as mammography or dental radiography.

An alternative layout for the calibration pixel 650 can include the capacitor 620 being formed as described above but positioned between the glass substrate 28 and the data line 84. For example, in this embodiment, the data line 84 can be formed in the same metal layer as the bias line 85 metal, which can be separated from the capacitor 620 electrodes by several insulating layers. Example spacing for the calibration pixel 650 can include a pitch of about 11 μm, so that about 16 calibration pixels 650 on each row can occupy only about 176 μm.

A further alternative layout for the calibration pixel 620 can include the capacitor 620 being positioned at least partially or completely under the data line 84. Example spacing for the calibration pixel 650 under the data line 84 can include a pitch between data lines (e.g., the data lines 84) themselves. This reduced spacing or minimal spacing when compared again to, for example, the spacing associated with dark reference pixels (e.g., 2,400 μm) can allow the imaging pixels 10 to be placed much closer to the edge of the imaging array 81.

Figure 8:
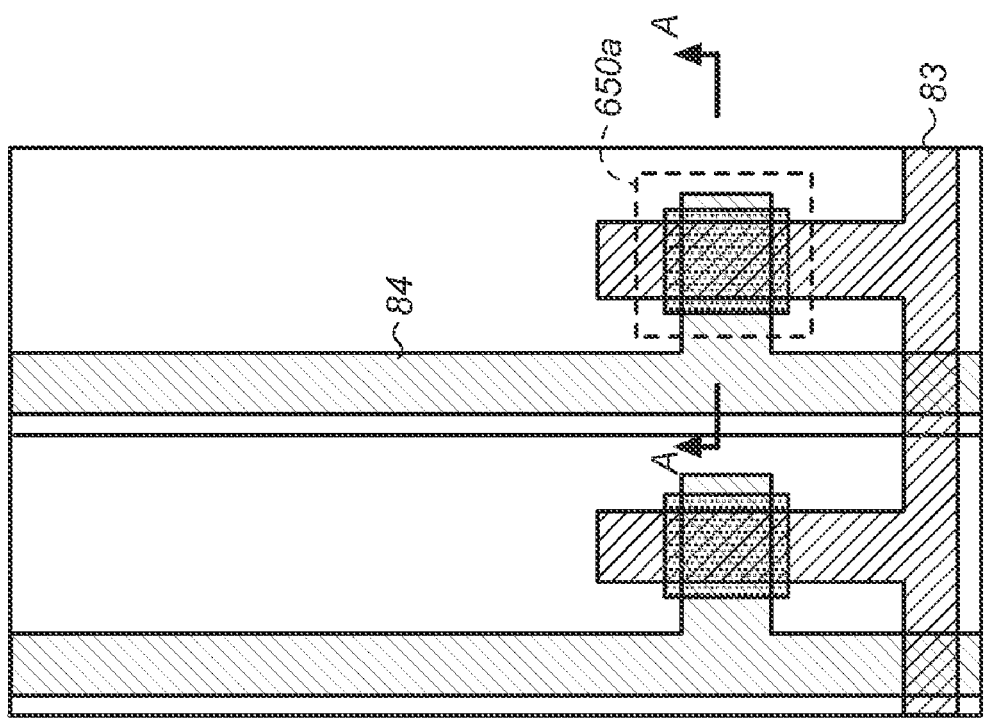
FIG. 8 is a schematic diagram that shows another embodiment of a calibration circuit (e.g., calibration pixel) according to present teachings.
Figure 9:
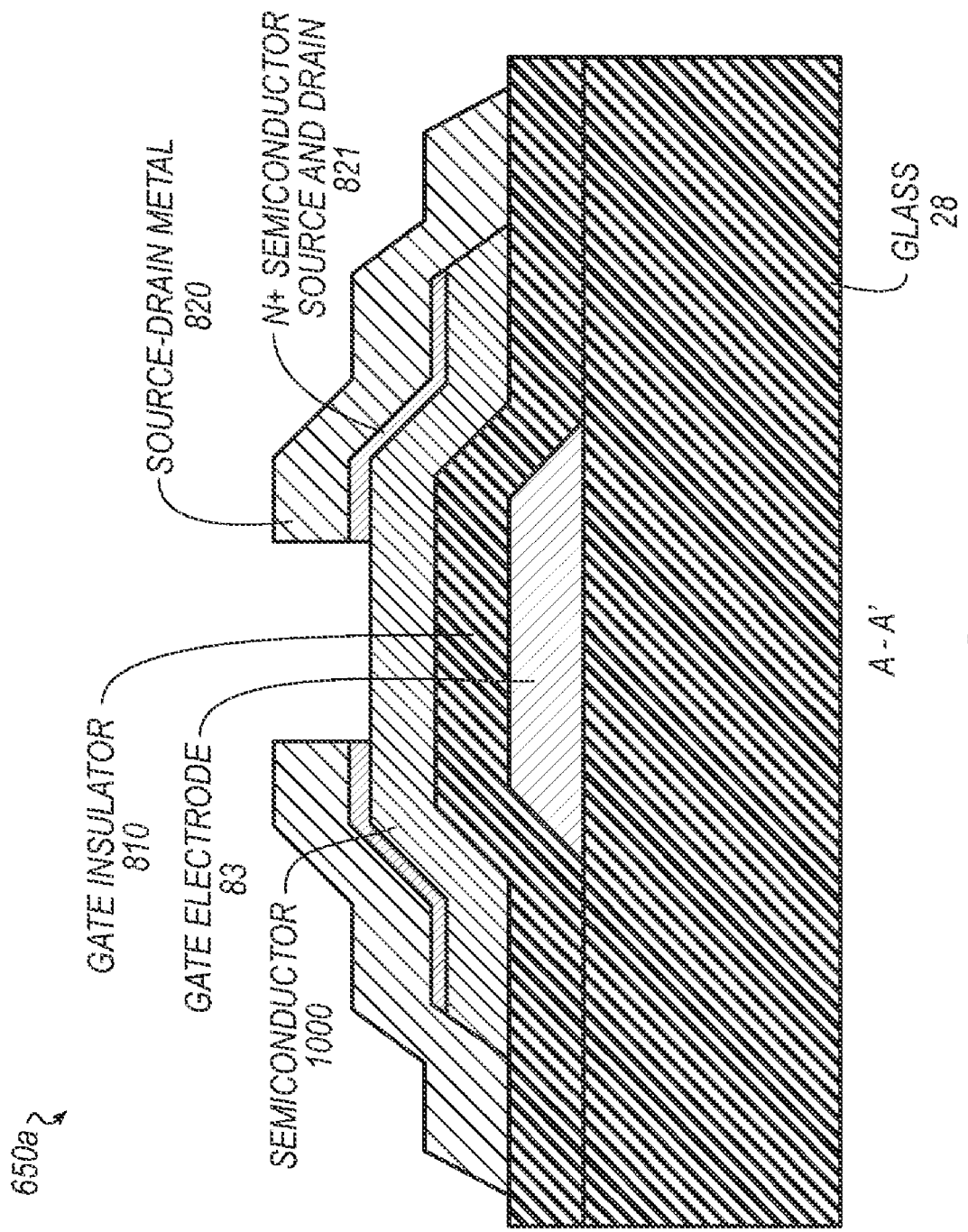
FIG. 9 is a diagram that shows an exemplary cross-sectional layout taken along line A-A' for the calibration pixel of FIG. 8.

FIG. 8 is a schematic diagram that shows another embodiment of a calibration circuit (e.g., calibration pixel) according to present teachings. FIG. 8 is a schematic diagram in which a MIS capacitor between data line and gate line can be used to emulate the parasitic capacitive coupling between data line and gate line. In another embodiment shown in FIGS. 8 thru 9, calibration pixels 650*a* incorporate a metal-insulator-silicon (MIS) capacitor 620 with a layout similar to or equivalent to the drain region of the TFT switch 71 of an optical pixel 10. The total capacitance between gate line 83 and data line 84 in the calibration pixel 650*a* can include both the MIS capacitor equivalent to the capacitance between the drain and the gate in the TFT switch 71 and the overlap capacitance due to the crossover between the gate line 83 and the data line 84. Both capacitances can be substantially equal in magnitude to the corresponding TFT and overlap capacitances in the optically active pixel 10, thereby producing a magnitude of feedthrough signal from gate line 83 to data line 84 substantially equal to the feedthrough signal in the optically active pixels 10. The exemplary embodiment shown in FIGS. 8-9 can allow for calibration for charge emission in bulk and interface states in the MIS capacitor (e.g., capacitor 620) formed in the drain region of the TFT switch 71 in the optically active pixels 10. As illustrated in FIG. 9, the drain region of the TFT switch comprises a gate electrode 83 (e.g., a sandwich of about 50 nm Mo, about 150 nm Al:Nd, and about 50 nm Mo), an insulator being the gate insulator 810, an undoped (intrinsic) amorphous silicon layer 1000 of about 100 nm, an N-type doped drain contact 821 of about 50 nm, and a drain electrode formed from the source-drain metal 820 (e.g., a sandwich of about 50 nm Mo, about 150 nm Al:Nd, and about 50 nm Mo).

It will be appreciated that the amorphous silicon 1000 in the drain region of the TFT switch 71 can include a high density of bulk and interface trap states, which can trap and release charge in response to clock signals on the gate line 83, which can result in additional offset charge. Inclusion of the calibration pixel 650*a* using the MIS capacitors emulating the drain region of the TFT 71 can allow sampling of this offset charge in the calibration pixels 650*a*. The total width of the calibration pixel 650*a* can be the same as the calibration pixels 650 discussed above. Embodiments can include calibration pixel columns 640 including both combinations of MIM capacitors and MIS capacitors used as calibration pixels 650. For example, the MIM capacitors can emulate the crossover capacitance that can be formed between the gate line 83 metal and the data line 84 metal that can be approximately equal to about an 8 micron by about 8 micron crossover size in the optically active pixels 10. The MIS capacitor emulating the drain region of the TFT 71 can be about 3 microns by about 20 microns, emulating the dimensions of the TFT 71 drain.

Figure 10:
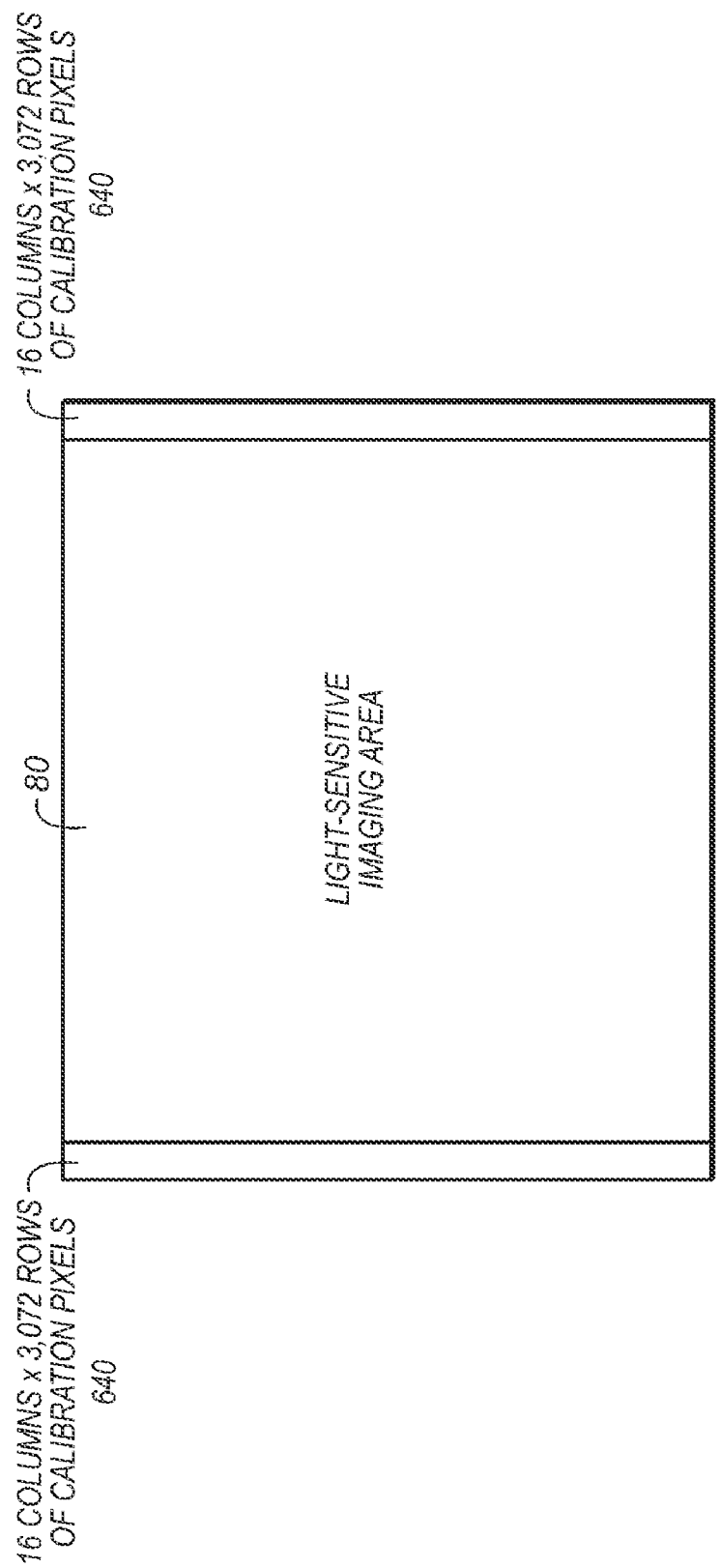
FIG. 10 is an exemplary imaging panel floor plan for an imaging array embodiment containing calibration pixels and optically sensitive pixels, according to present teachings.

FIG. 10 is an exemplary imaging panel floor plan for an imaging array including both calibration pixel embodiments and optically sensitive pixels, according to present teachings. FIG. 10 can be a floor plan for about a 43 cm by about 43 cm radiographic imaging array 80 incorporating the calibration pixels 650, 650*a* of FIGS. 5 thru 9. The calibration pixels 650, 650*a* can be arranged in a border (rows and/or columns 640) around the imaging area. Calibration pixels 650, 650*a* can be provided on each side of each row for offset calibration of the optically active pixels in that row during array readout. Calibration pixels 650, 650*a* can also be provided at the top and bottom (not shown) of the array 80 for calibration of column offset of each column in the array 80. In one embodiment, a method of readout of the array of FIG. 10 can be identical to the method of readout of conventional art imaging arrays with calibration pixels consisting of light-shielded photodiodes.

In embodiments described above, the capacitor 620 between the gate line 83 and the data line 84 in the calibration pixels 650 can be sized to equal about the total capacitance between the gate line 83 and the data line 84 in the array. The signal-to-noise ratio (S/N) of the calibration pixels 650 can be limited by the noise in the charge amplifier 86 in a read-out integrated circuit or die attached to the column. An improved signal-to-noise ratio of the calibration pixels 650 can be obtained by sizing the components such as the capacitive elements or capacitors in the calibration pixels 650, 650*a* to produce a higher signal than the corresponding components (e.g., TFT 71) in the optically active pixels 10. In exemplary embodiments, the capacitor 620 between the gate line 83 and data line 84 in the calibration pixel 650, 650*a* can be sized to produce a capacitance between the data line 84 and the gate line 83 larger than the capacitance in the optically active pixels 10. The larger capacitance in the capacitive elements (e.g., calibration pixels 650, 650*a*) will make the noise signal larger and easier to detect or more accurate when detected. This can further allow for the use of fewer capacitive elements (e.g., calibration pixels 650, 650*a* or 640) being used in the exemplary embodiments while the accuracy or the measured noise remains consistent. For example, as described above, one embodiment of the calibration pixels 650 can include a MIM capacitor of about 8 μm by about 50 μm to yield about a 50 fF capacitance between the gate line 83 and the data line 84, equaling about 50 fF capacitance in the about 139 μm by about 139 μm dimension optically active pixels 10. Increasing the MIM capacitor dimensions to about 16 μm by about 100 μm can result in a calibration pixel signal that is larger than the corresponding offset signal in the optically active pixels 10. Further, because a significant proportion of the total data line capacitance can be the overlap capacitance between the data line 84 and the gate line 83, the percentage increase in signal level can be lower than the percentage increase in overlap capacitance. However, the increase in dimensions can still produce an overall increase in signal level of the feedthrough from the gate line 83 to the data line 84. For example, following digitization and averaging of the calibration pixels 650, 650a in one embodiment, one-fourth of the calibration pixel average can be subtracted from each optically active pixel 10 in the corresponding row. The accuracy of the calibration pixel average is thereby improved by about two times to about four times. This improved accuracy in noise passed by overlap capacitance can also allow fewer calibration pixels 650 to be used for row and column offset correction.

Figure 13:
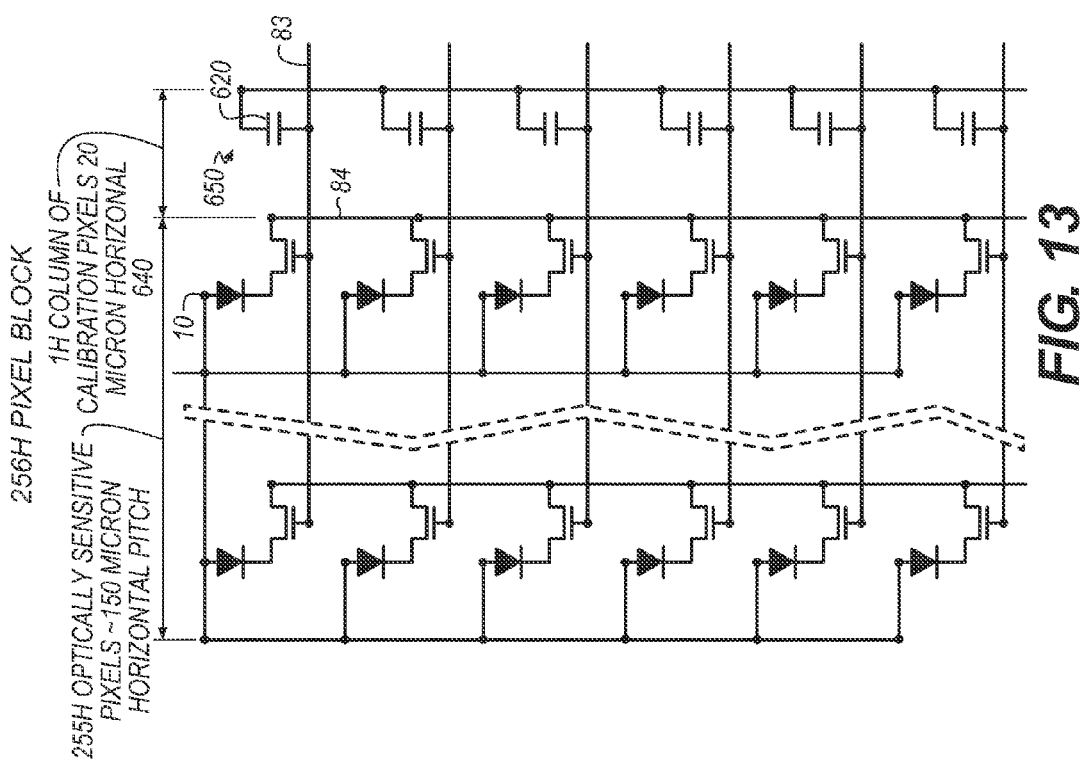
FIG. 13 is a diagram that shows an exemplary floor plan in which calibration pixels are embedded within an imaging array embodiment, according to present teachings.
Figure 12:
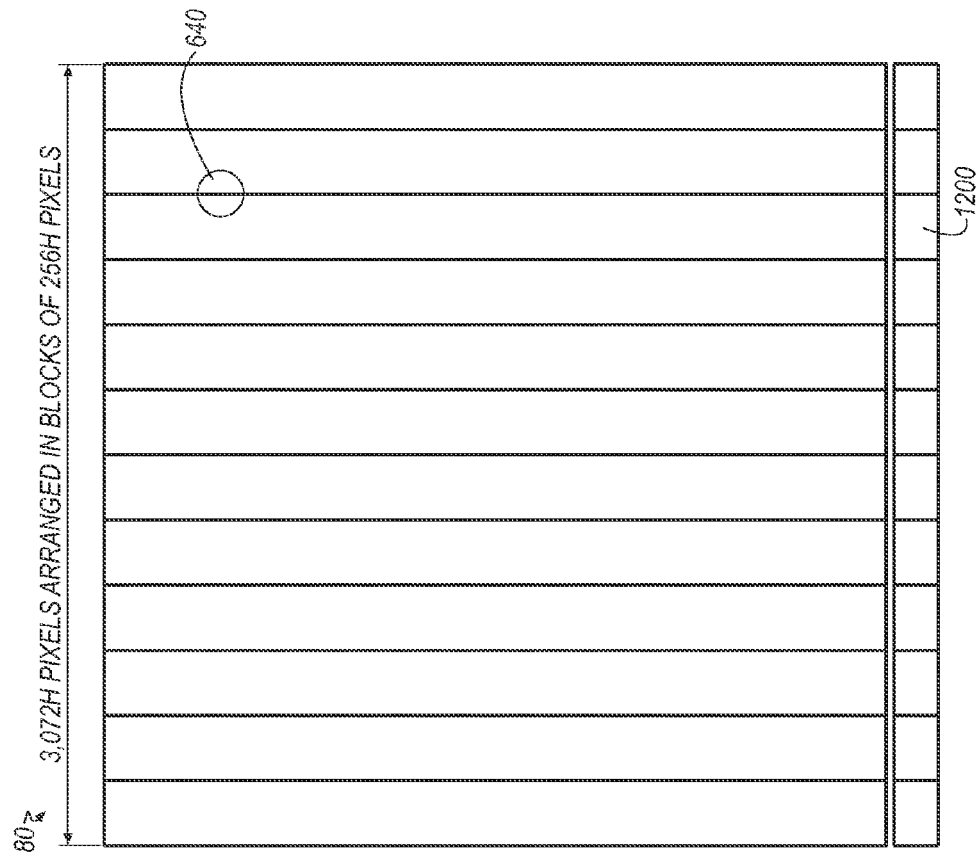
FIG. 12 is a diagram that shows an exemplary floor plan in which calibration pixels are embedded within an imaging array embodiment, according to present teachings.

As shown in FIGS. 12 and 13, the calibration pixels 650 can be interspersed among the imaging pixels 10 within the array 81. For example, embodiments can include a single column 640 of calibration pixels 650 inserted between groups of 255 pixels 10. Also, samples of calibration pixels 650 can be obtained at repeated locations (e.g., regular intervals, irregular intervals) throughout the width of the array 80. This can allow for an increase in accuracy of the calibration offset of the neighboring optically active pixels 10.

Figure 11:
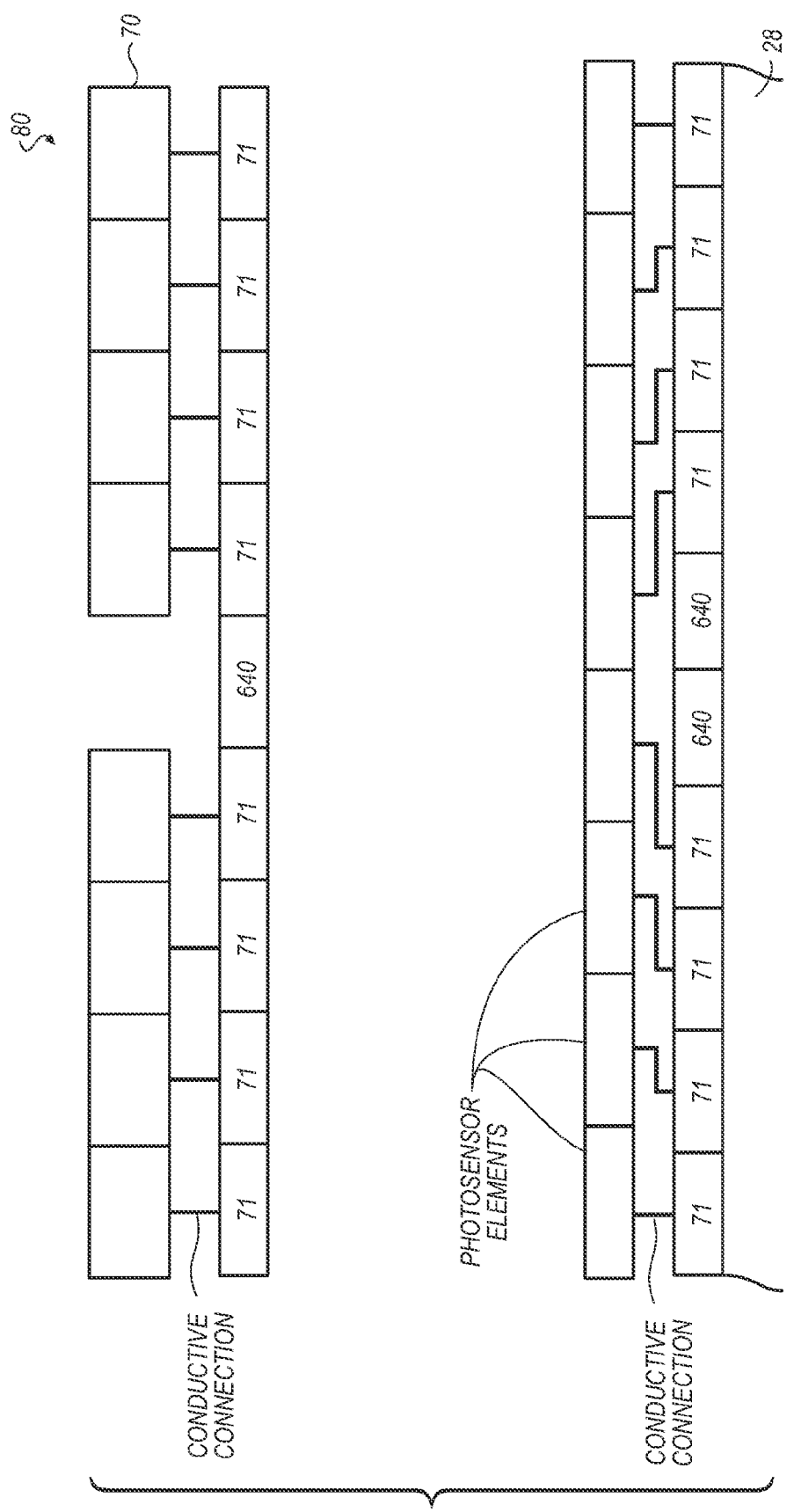
FIG. 11 is a diagram that shows an exemplary relationship between a photosensing element layer and a readout layer of a flat panel image sensor including calibration circuits and optically sensitive pixels, according to present teachings.

In one embodiment shown in FIG. 11, one or more columns 640 of calibration pixels 650 can be inserted between groups of N pixels 10. In one embodiment, this can result in a gap at the photosensor 70 layer of the imaging panel. Alternatively, in another exemplary embodiment, the width of each of the N pixels 10 can be reduced by 1/N (e.g., 1/255) times the width of the column 640 of calibration pixels 650, or about 1/N* (calibration pixel width) microns (e.g., about 0.04 microns or 1/255 where N=255), to maintain the overall column pitch. Accordingly, one or more calibration pixels or columns of calibration pixels 640 can be interspersed under a continuous photosensor 70 layer of the imaging panel. As shown in FIG. 11 or FIG. 12, the optically active pixels 10 can extend to the edge of the array 80 and thereby close to the edge of the glass substrate 28. FIG. 11 can illustrate a photosensor layer and a transistor layer of a flat panel detector, although other layouts or configurations can be used. In exemplary embodiments, the photosensor 70 is between the scintillator and the calibration pixels.

Embodiments can include vertically-integrated large-area image sensors using flat panel detectors in which readout elements are in a backplane and the photosensing elements are formed in a frontplane, e.g., with deposited semiconductor layers such as amorphous silicon. In exemplary embodiments, to reduce or eliminate gaps between the photosensing elements caused by calibration pixels in the readout elements, the horizontal and/or vertical pitch of the readout elements on the backplane can be smaller than the horizontal and vertical pitch of the photosensing elements on the frontplane as shown in FIG. 11. For example, if the desired photosensor pixel pitch in the frontplane is $P_{PS}$, the pitch of the pixels on the backplane formed in the silicon tiles are $P_{RO}$, then $P_{PS} > P_{RO}$. The pitch of the readout elements can be reduced or the pitch of the photosensing elements can be increased. The difference in pixel pitch allows the photosensors in the frontplane, which are vertically-integrated above (e.g., on the backplane array and opposite the glass substrate) the backplane, to bridge at least a portion of the gap, if not the entire gap, corresponding to or over the calibration pixels as shown in FIG. 11. In one embodiment, only a subset (e.g., 10 adjacent readout elements, 20 adjacent pixels) of readout elements adjacent or nearby the interspersed calibration pixels have an altered (e.g., reduced) dimension or pitch as described herein.

As is well known in the art, the resistance and capacitance of the gate lines 83 and the data lines 84 in flat-panel imaging arrays can be sufficient to filter or distort signals on those lines. The offsets due to clock feedthrough and due to noise and electro-magnetic pick-up will vary across the width of the array. By obtaining pixel offset calibration values from columns of calibration pixels every 256 columns, more accurate values can be obtained. The overlap capacitance 605 in the calibration pixels can be made equal to the total capacitance between the data line 84 and the gate line 83 in the optically active pixels 10, in which case the magnitude of the feedthrough between the data line 84 and the gate line 83 can be substantially equal to the feedthrough in the optically active pixels 10. Alternatively, the calibration pixels 650 can contain a capacitor 620 between the data line 84 and the gate line 83 larger than the corresponding capacitance in the optically active pixels 10 in order to produce a larger signal level of the feedthrough signal between the gate line 83 and the data line 84.

In the embodiments shown in FIGS. 12 and 13 in which the calibration pixels are interspersed throughout the imaging array, one or more columns 640 of calibration pixels may be allocated for each ROIC/die 1200. These exemplary calibration pixels may be used for calibration of the offset in each row of a particular charge amplifier die due to ripple in the reference voltage supply for that particular die 1200 and plurality of charge amplifiers. As shown FIG. 12, the column 640 aligns at one edge of the die 1200. Alternatively, the column 640 can align at different portions of the die 1200 (e.g., middle, 25% from an edge, the $10^{th}$ or $100^{th}$ column, etc.). More than one column 640 can be provided for each ROIC/die 1200.

Figure 16:
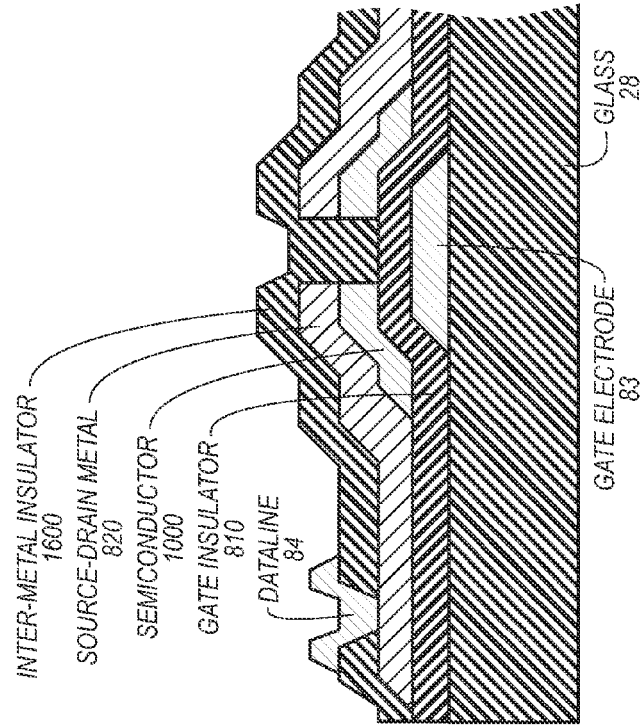
FIG. 16 is a cross-sectional diagram taken along line A-A' that shows an exemplary cross-section for the calibration pixel of FIG. 15.
Figure 15:
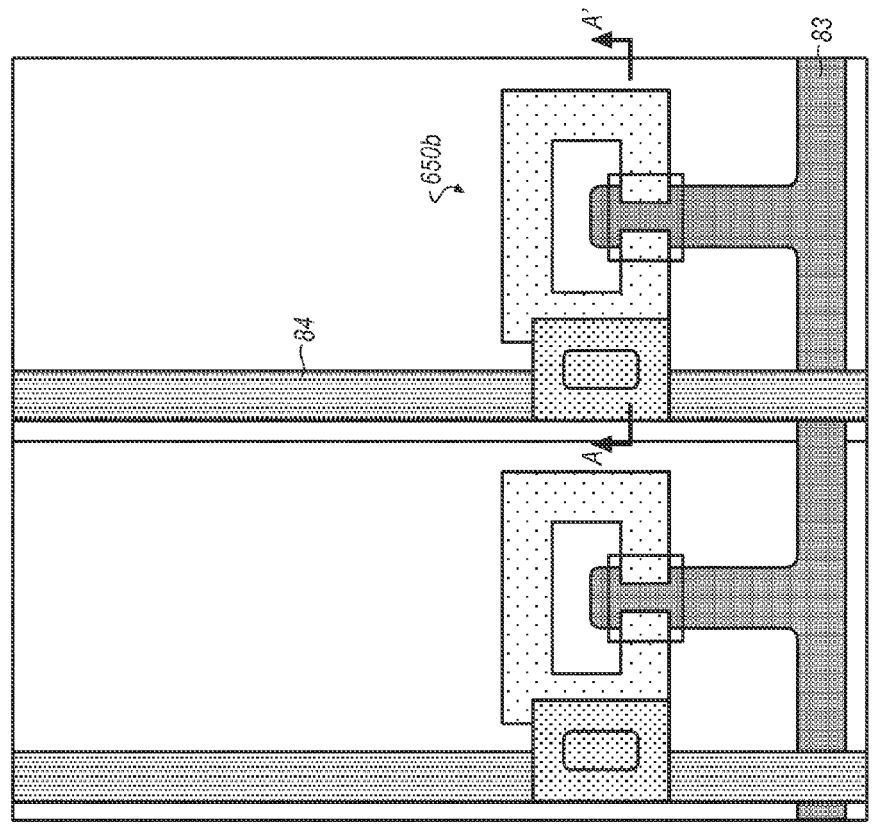
FIG. 15 is a diagram that shows an exemplary layout for the calibration pixel of FIG. 14.

FIG. 14 is a schematic diagram that shows another embodiment of a calibration circuit (e.g., calibration pixel 650) according to present teachings. FIG. 14 is a schematic diagram in which calibration pixel 650b can be a transistor with drain and source shorted to emulate the parasitic capacitive coupling between data line and gate line. As shown in FIGS. 14 thru 16, the calibration pixels 650b can incorporate a MIM capacitor 620 about equal in value to the overlap capacitance between the gate line 83 and the data line 84 and a thin-film-transistor (TFT) switch 1400 of about half the gate width and about the same gate length as the transistor 71 in the optically active pixels 10. As shown, the source and drain of the transistor 1400 are electrically connected and covered by an inter-metal insulator 1600. FIG. 14 shows a schematic diagram of a 2 by 4 pixel section of a passive-pixel image sensor 80 with PIN photodiode 70 column 640 of calibration pixels 650b. One advantage of the calibration pixel 650b embodiment can be the ability to calibrate for charge emission in bulk and interface states in the channel region of the thin-film transistor 71 in the optically-active pixels 10. As is well known in the art, amorphous silicon in the channel region between the source and the drain in an amorphous silicon thin-film-transistor switch can trap and release charge in response to the clock signals on a gate line, which can result in additional offset charge. Inclusion of MIS capacitors 620 emulating the channel region as well as the drain region allows sampling of this offset charge in the calibration pixels 650b. Since the charge can flow both to the source and the drain of the transistor 71 in the optically active pixels 10, scaling the transistor 1400 width in the calibration pixels 650*b* to about half the gate width can allow a close approximation to the offset in the optically active pixels 10 although other physical dimension modifications can be used. The total width of the calibration pixel 650*b* can be about the same as the calibration pixel 650, 650*a* embodiments described above.

Figure 17:
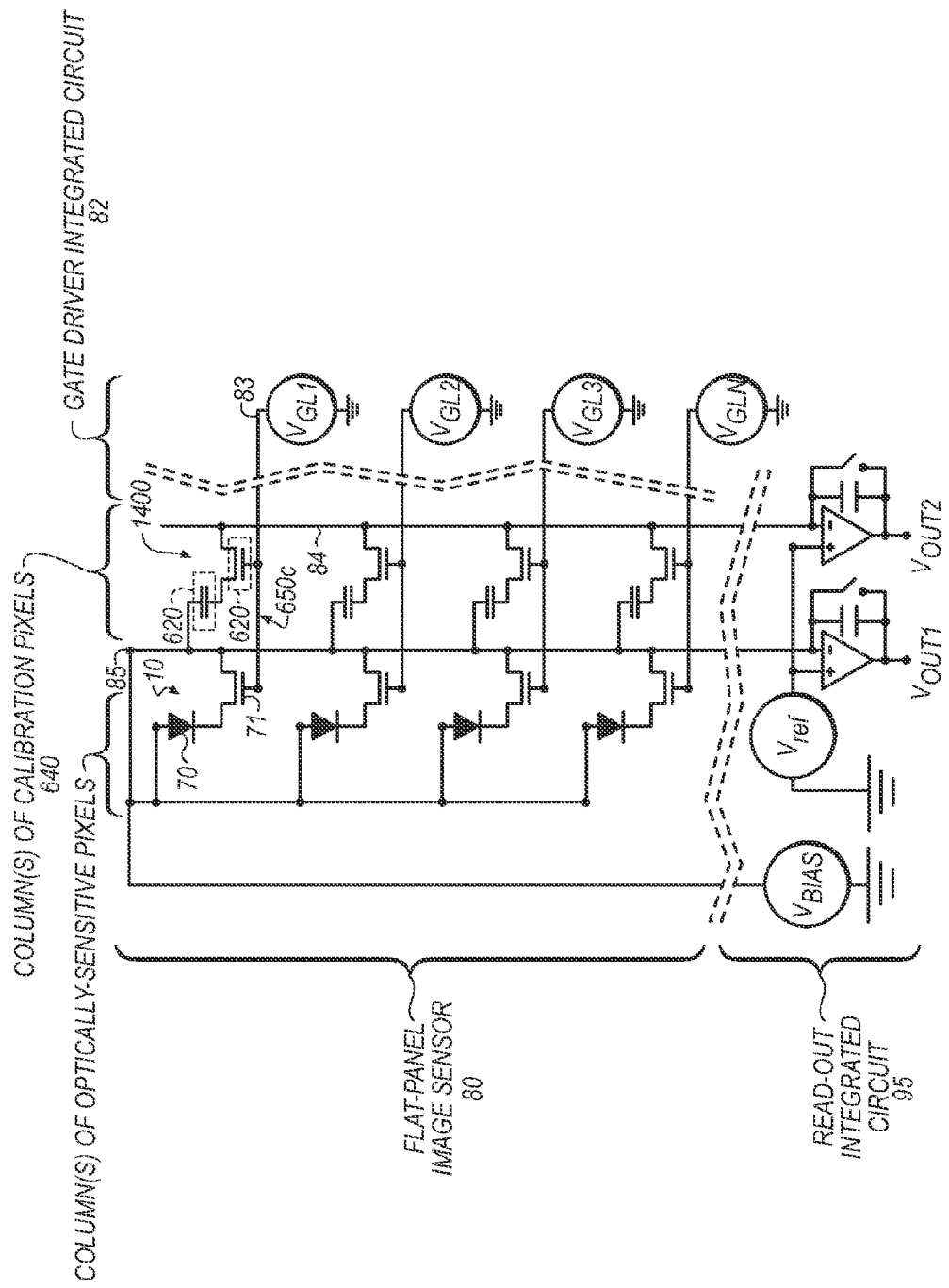
FIG. 17 is a schematic diagram that shows another embodiment of a calibration circuit (e.g., calibration pixel) according to present teachings.
Figure 18:
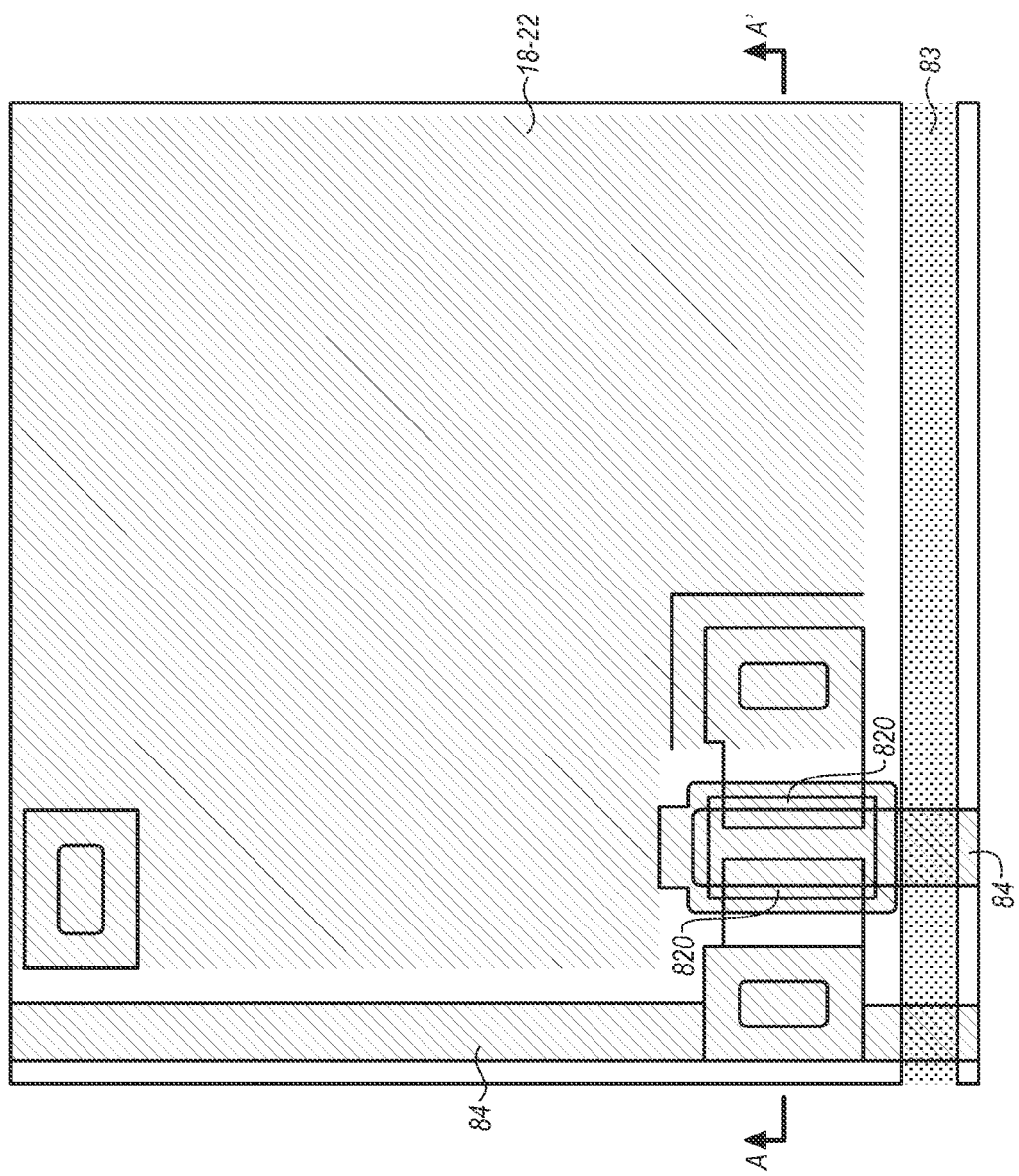
FIG. 18 is a diagram that shows an exemplary layout for the calibration pixel of FIG. 17.
Figure 19:
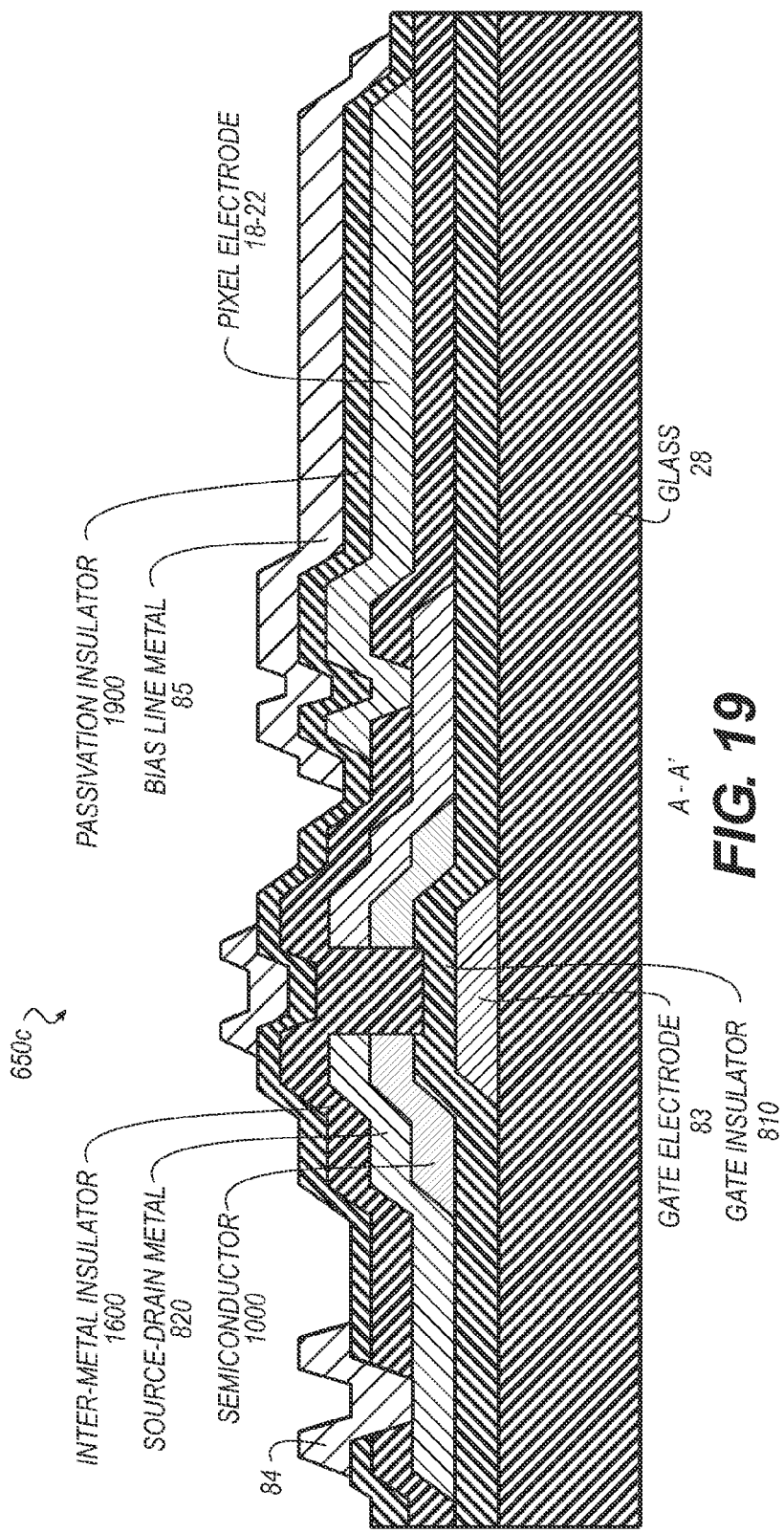
FIG. 19 is a cross-section diagram taken along line A-A' that shows an exemplary cross-section for the calibration pixel layout of FIG. 18.

Although the calibration pixel 650, 650*a*, 650*b* embodiments described above can calibrate for noise sources that are uncorrelated in frequency and phase with the array readout, such as power-supply fluctuation for the gate-line clock power supplies, noise ripple on the gate lines and for electromagnetic interference on the gate lines and the data lines, as well as for fixed-pattern offsets correlated with the array readout, such as charge amplifier offsets and gate-line clock feedthrough, they can not calibrate for bias line voltage noise. Bias line voltage noise can be caused by noise in the power supplies for the bias line voltage and from electro-magnetic pick-up in the bias supply or the bias lines. Bias line voltage noise is generally uncorrelated with the array readout and thereby cannot be removed in dark-reference-frame subtraction. FIG. 17 is a schematic diagram that shows another embodiment of a calibration circuit (e.g., calibration pixel) according to present teachings. FIG. 17 is a schematic diagram in which the row-select TFT addresses a MIM capacitor connected to the bias line. As shown in FIGS. 17 thru 19, the calibration pixels 650*c* can incorporate a TFT switch 1400 and a capacitor 620 between the TFT 1400 source and the bias line 85. The capacitor 620 can be formed from two or more metal layers and one or more dielectric layers. FIG. 17 shows a schematic diagram of a 2 by 4 pixel section of a passive-pixel image sensor 80 with PIN photodiode 70 column 640 of calibration pixels 650*c*. An example layout is shown in FIG. 18 and an example cross-section in FIG. 19. The MIM capacitor 620 between the drain of the TFT 1400 and the bias line is formed by a parallel plate capacitor of pixel electrode metal, passivation insulator 1900 (e.g., nitride) and the bias line 83 metal. It will be evident to one skilled in the art that the MIM capacitor 620 between the drain of the TFT 1400 and the bias line 85 can be formed using various other combinations of metal and insulating layers. It will also be obvious to one skilled in the art that capacitors of various layers could be stacked above one another in order to increase the capacitance per unit area.

Adjustments in the size of the calibration pixel 650, 650*a*, 650*b*, 650*c* elements for the various embodiments can be made to increase the calibration signal in comparison to the corresponding offset signal in the calibration pixel 650, 650*a*, 650*b*, 650*c* thereby allowing higher accuracy in the digitization of the calibration value for each row and column or allowing fewer calibration rows and columns 640 with the equivalent accuracy.

FIGS. 20A-20B are diagrams that show an exemplary embodiment of calibration pixels according to present teachings. As shown in FIGS. 20A-20B, the calibration pixel 650 is configured under the data line 84. Thus, the data line 84 can also provide light-shielding for the calibration pixel 650. As shown in FIG. 20B, one terminal of a MIM capacitor forming the calibration pixel 650 can be formed by a gate layer metal, the gate electrode metal or an extension of the gate lines 83 and the second terminal of the MIM capacitor forming the calibration pixel 650 can be formed by data line 84 (e.g., or a thicker portion of/including the data line 84). The dielectric of the MIM capacitor forming the calibration pixel 650 can be an insulating layer 2010.

Embodiments that include calibration pixel columns 640 under the data lines 84 can reduce a pixel pitch in the column direction (between the columns of the calibration pixels) to a minimal or reduced distance set by the dimension of data line 84 or adjacent data lines 84 (e.g., minimum feature size). As shown in FIGS. 20A-20B, different calibration pixels 650 can have different dimensions or sizes.

FIGS. 21A-21B are diagrams that show an exemplary embodiment of calibration pixels according to present teachings. As shown in FIGS. 21A-21B, the calibration pixel 650 is configured under the data line 84. Thus, the data line 84 can also provide light-shielding for the calibration pixel 650. As shown in FIG. 21B, one terminal of a MIS capacitor forming the calibration pixel 650 can be formed by a gate layer metal, the gate electrode metal or an extension of the gate lines 83 and the second terminal of the MIS capacitor forming the calibration pixel 650 can be formed by metal layer 2120 coupled through second insulating layer 2100 to the data line 84 (e.g., or a thicker portion of/including the data line 84) by a conductive via 2121. The MIS capacitor forming the calibration pixel 650 can include the insulating layer 2010, an undoped (intrinsic) semiconductor layer 2100 over the insulating layer 2010, and a highly doped (N/P-type) contact 2121 over the semiconductor layer 2100 and under the second terminal 2120. The embodiment shown in FIGS. 21A-21A can emulate the amorphous silicon in the source region and/or drain region of the TFT switch 71 in the optically sensitive pixels 10.

FIGS. 22A-22B are diagrams that show an exemplary embodiment of calibration pixels according to present teachings. As shown in FIGS. 22A-22B, the calibration pixel 650 is configured under the data line 84. As shown in FIG. 22B, although the undoped (intrinsic) semiconductor layer 2100 over the insulating layer 2010, is continuous, the highly doped contact 2121, the metal layer 2120, and the conductive via 2121 are split into more than one before making contact with the data line 84.

Figure 23:
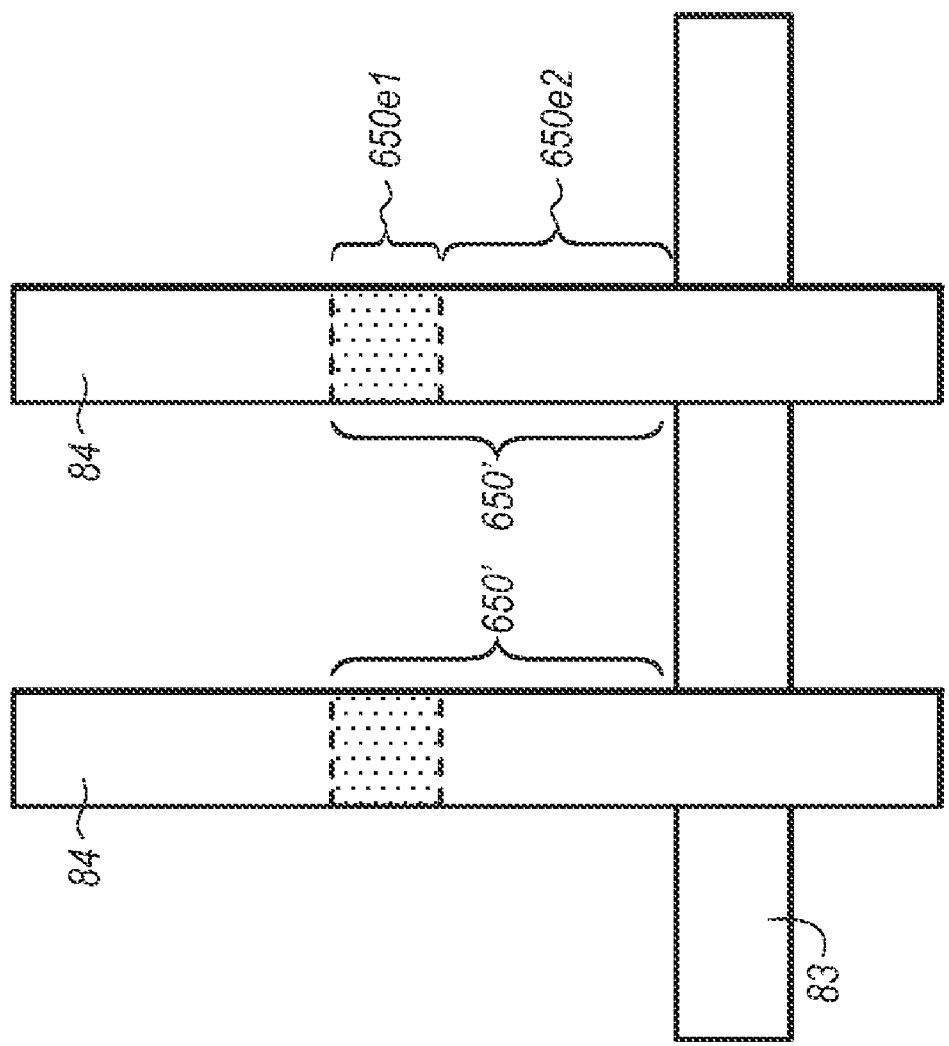
FIG. 23 is a diagram that shows an exemplary embodiment of a calibration pixel according to present teachings.

FIG. 23 is a diagram that shows an exemplary embodiment of calibration pixels according to present teachings. As shown in FIG. 23, calibration pixels 650' are configured under the data line 84 and include more than one type of calibration pixel such as calibration pixel 650*e*1 (e.g., including a MIS capacitor) and calibration pixel 650*e*2 (e.g., including a MIM capacitor). For example in the calibration pixel 650', the calibration pixel 650*e*2 can be used to address overlap capacitance and the calibration pixel 650*e*1 can be used to address the noise generated by the transistor structure (e.g., amorphous silicon). Alternatively in the calibration pixel 650', the calibration pixel 650*e*1 can be used to address overlap capacitance and the calibration pixel 650*e*2 can be used to implement scaler α noise multiplier to increase accuracy in measuring noise generated in the optically sensitive pixels 10.

Figure 24:
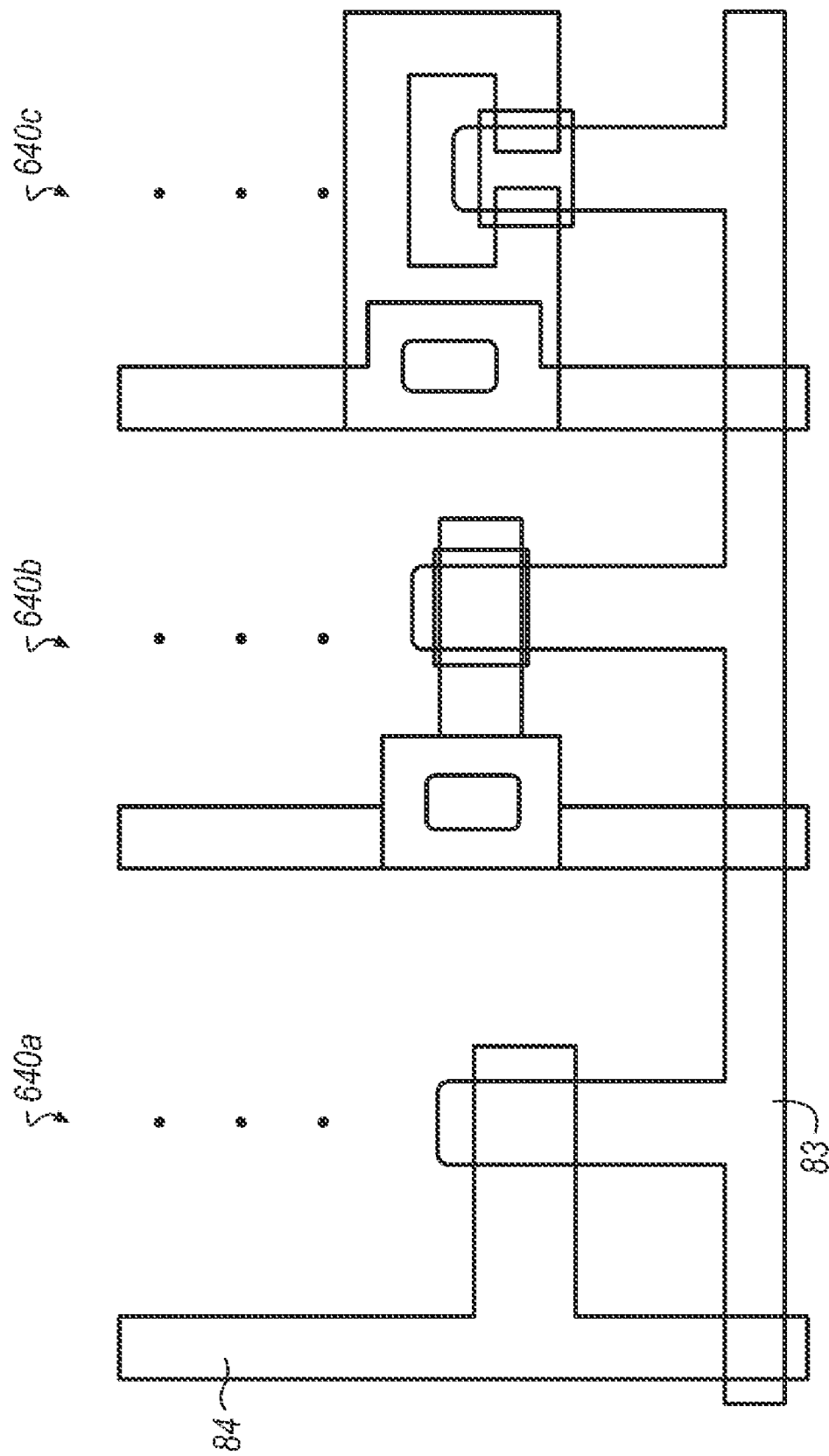
FIG. 24 is a diagram that shows an exemplary embodiment of a calibration pixel according to present teachings.

FIG. 24 is a diagram that shows an exemplary embodiment of calibration pixels according to present teachings. According to exemplary embodiments, different type of calibration pixels can be used in combination in the array 80. For example, different type of capacitive elements are used in different columns 640 of calibration pixels. As shown in FIG. 24, different type of capacitive elements are used in different columns 640*a*, 640*b* and 640*c* of calibration pixels. According to present teachings, different correction coefficients can be assigned to each different type of calibration pixels in the column 640, which can be used to combine the overall correction generated by the calibration pixels (e.g., 650, 650*a*, 650*b*, 650*c*, 650') and combinations thereof in the array 80. In one embodiment, correction coefficients x, y, and z can be used to combine the data generated by the calibration columns 640*a*, 640*b*, 640*c* and calibrate the array 80. For example, calibration data generated by the calibration columns 640a, 640b, 640c can be linearly or non-linearly combined, where a corrective calibration (CC)=x(640a)+y(640b)+z(640c).

Embodiments according to one aspect of the application can provide a method for operating a radiographic flat panel digital detector for capturing a plurality of x-ray images of an object including providing a scintillator for receiving incident radiation at a first wavelength and responding by emitting excited radiation at a second wavelength; providing an array of photosensing elements coupled to the scintillator, wherein each photosensing element provides a variable signal in response to the second wavelength radiation; providing an array of calibration units under a portion of the array of photosensing elements to generate calibration data not temporally related to the second wavelength radiation, each calibration unit including a capacitive element coupled between a data line and a scan line; reading out a first signal for at least some of the photosensing elements in the array of photosensing elements using data lines extending beyond the array of photosensing elements, wherein the first signal results from incident radiation directed to the scintillation screen, representing a first image signal thereby; and reading out a calibration signal for at least some of the calibration units to at least one data line extending beyond the array of photosensing elements to a first sensing circuit displaced from the array of photosensing elements.

While the invention has been illustrated with respect to one or more implementations, alterations and/or modifications can be made to the illustrated examples without departing from the spirit and scope of the appended claims. In addition, while a particular feature of the invention can have been disclosed with respect to only one of several implementations, such feature can be combined with one or more other features of the other implementations as can be desired and advantageous for any given or particular function. The term "about" indicates that the value listed can be somewhat altered, as long as the alteration does not result in nonconformance of the process or structure to the illustrated embodiment. Further, "exemplary" indicates the description is used as an example, rather than implying that it is an ideal. Other embodiments and/or combinations of embodiments of the application will be apparent to those skilled in the art from consideration of the specification and practice of the invention disclosed herein. It is intended that the specification and examples be considered as exemplary only, with a true scope and spirit of the invention being indicated by the following claims.

What is claimed:

1. A radiographic sensing array comprising:
a scintillator configured to emit light in response to reception of radiation;
a plurality of optically sensitive pixels formed over a substrate arranged to form a light-sensitive area optically coupled to the scintillator, wherein each optically sensitive pixel comprises:
a scan line oriented along a first direction of the array;
a data line oriented along a second direction of the array;
a bias line;
a switching element comprising a first electrode, a second electrode connected to the data line, and a control electrode connected to the scan line; and
a photosensitive element including at least first and second electrodes, the first electrode electrically connected to the bias line and the second electrode electrically connected to the first electrode of the transistor; and
a plurality of calibration pixels, wherein each calibration pixel comprises:
a scan line;
a data line;
a capacitive element coupled between the data line and the scan line, where the calibration pixels do not include photosensitive elements.

2. The radiographic sensing array of claim 1, wherein the plurality of calibration pixels are disposed along at least the first direction of the array or the plurality of calibration pixels are disposed along at least the second direction of the substrate, wherein the first direction is a horizontal or scan direction and the second direction is a vertical or column direction of the array.

3. The radiographic sensing array of claim 1, wherein the plurality of calibration pixels are external to the plurality of optically sensitive pixels, where the capacitive element does not include at least a part of photosensitive element.

4. The radiographic sensing array of claim 1, wherein columns of optically sensitive pixels occupy a first length along the first direction and columns of the plurality of calibration pixels occupy a second length along the first direction, wherein the second length is less than the first length.

5. The radiographic sensing array of claim 4, wherein the second length is less than 85% of the first length, wherein the second length is less than 50% of the first length, wherein the second length is less than 25% of the first length, or wherein the second length is less than 10% of the first length.

6. The radiographic sensing array of claim 5, wherein the columns of the plurality of calibration pixels are interspersed among the columns of optically sensitive pixels, wherein the interspersed calibration pixels are provided for each read out integrated circuit (ROTC).

7. radiographic sensing array of claim 5, wherein the columns of the plurality of calibration pixels are along at least one edge of the columns of optically sensitive pixels.

8. The radiographic sensing array of claim 1, the capacitive elements comprise metal-insulator-metal type capacitors or metal-insulator-semiconductor type capacitors; a first metal electrode, a second metal electrode, an insulator and a Semiconductor; a transistor including a first electrode, a second electrode connected to the data line and a control electrode connected to the scan line; or the transistor including the first electrode and the second electrode connected to the data line, and the control electrode connected to the scan line.

9. The radiographic sensing array of claim 1, wherein each capacitive element comprises an overlap capacitor.

10. The radiographic sensing array of claim 1, wherein capacitance of the capacitive element between the scan line and a column line in the plurality of calibration pixels is configured to correspond to capacitance between the scan line and the drain line in the optically active pixels, or wherein total overlap capacitance between the scan line and the column line in the calibration pixels is about equal to total capacitance between the scan line and the column line in the optically sensitive pixels.

11. The radiographic sensing array of claim 1, wherein capacitance of the capacitive element between the scan line and a column line in the plurality of calibration pixels is greater than the capacitance between the scan line and the column line in the optically active pixels by a scale factor $\alpha$ or wherein total overlap capacitance between the scan line and the column line in the calibration pixels is greater than total capacitance between the scan line and the column line in the optically sensitive pixels by the scale factor $\alpha$.

12. The radiographic sensing array of claim 11, wherein the value of the scale factor $\alpha$ is 2, a binary multiple, an integer multiple or a fractional multiple.

13. The radiographic sensing array of claim 1, wherein the plurality of calibration pixels further comprises:
 a plurality of thin-film-transistors, wherein each thin-film-transistor comprises a first electrode and a second electrode connected to the data line, and a control electrode connected to the scan line, wherein the thin-film-transistor in the calibration pixels is substantially identical to the transistor in the optically sensitive pixels.

14. The radiographic sensing array of claim 1, wherein the capacitive elements comprise capacitors, and wherein each data line is vertically oriented over each entire corresponding capacitor.

15. The radiographic sensing array of claim 1, wherein the plurality of calibration pixels are configured to compensate noise occurring in the optically sensitive pixels that is temporally not related to timing of image data read out by the optically sensitive pixels or dark reference frames detected by the optically sensitive pixels.

16. The radiographic sensing array of claim 15, wherein the noise occurring in the optically sensitive pixels that is temporally not related to data readout from the optically sensitive pixels comprises at least one of power supply noise and electro-magnetic interference noise generated through the data lines, power supply noise and electro-magnetic interference noise generated through the bias lines, reference power supply noise and noise charge on a feedback capacitor of a charge amplifier, electro-magnetic interference noise generated through the scan lines or feedthrough of a gate line row select clock.

17. The radiographic sensing array of claim 15, wherein the noise occurring in the optically sensitive pixels that is temporally not related to data readout from the optically sensitive pixels comprises all of power supply noise and electro-magnetic interference noise generated through the data lines, reference power supply noise and noise charge on a feedback capacitor of a charge amplifier or feedthrough of the gate line row select clock,
 wherein the capacitive elements comprise metal-insulator-metal type capacitors, metal-insulator-semiconductor type capacitors, or a transistor including a first electrode and a second electrode connected to the data line, and a control electrode connected to the scan line.

18. The radiographic sensing array of claim 1, wherein each of the plurality of calibration pixels further comprises:
 the bias line;
 and wherein the capacitive element comprises,
  a transistor including a first electrode, a second electrode connected to the data line, and a control electrode connected to the scan line; and
  a capacitor comprising a first electrode, an insulator and a second electrode, the first electrode being electrically connected to the bias line and the second electrode being electrically connected to the first electrode of the transistor.

* * * * *